United States Patent
Lu et al.

(10) Patent No.: US 11,949,037 B2
(45) Date of Patent: Apr. 2, 2024

(54) LOCAL PATTERNING AND METALLIZATION OF SEMICONDUCTOR STRUCTURES USING A LASER BEAM

(71) Applicant: Maxeon Solar Pte. Ltd., Singapore (SG)

(72) Inventors: Pei Hsuan Lu, San Jose, CA (US); Benjamin I. Hsia, Fremont, CA (US); Taeseok Kim, Pleasanton, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 17/744,519

(22) Filed: May 13, 2022

(65) Prior Publication Data
US 2022/0352407 A1 Nov. 3, 2022

Related U.S. Application Data

(63) Continuation-in-part of application No. 16/377,102, filed on Apr. 5, 2019, now Pat. No. 11,362,234, (Continued)

(51) Int. Cl.
*H01L 31/18* (2006.01)
*B23K 26/382* (2014.01)
(Continued)

(52) U.S. Cl.
CPC ............ *H01L 31/18* (2013.01); *B23K 26/382* (2015.10); *H01L 31/022441* (2013.01);
(Continued)

(58) Field of Classification Search
CPC ............ H01L 31/022441; H01L 31/18; B23K 26/382
See application file for complete search history.

(56) References Cited

U.S. PATENT DOCUMENTS

| 7,687,334 B2 | 3/2010 | Zou et al. |
| 9,620,661 B2 | 4/2017 | Kim et al. |
| (Continued) | | |

FOREIGN PATENT DOCUMENTS

| WO | WO 2013/142892 | 10/2013 | |
| WO | WO-2014023668 A1 * | 2/2014 | ..... H01L 31/022425 |

OTHER PUBLICATIONS

Lu, et al., "Laser-Doping through Anodic Aluminum Oxide Layers for Silicon Solar Cells," Journal of Nanomaterials, vol. 2015, Article ID 870839, Jul. 1, 2015, 6 pages.
(Continued)

*Primary Examiner* — Andrew J Golden
(74) *Attorney, Agent, or Firm* — Schwabe, Williamson & Wyatt, P.C.

(57) ABSTRACT

Local patterning and metallization of semiconductor structures using a laser beam, e.g., micro-electronic devices, semiconductor substrates and/or solar cells, are described. For example, a method of fabricating a solar cell includes providing a substrate having an intervening layer thereon. The method also includes locating a metal foil over the intervening layer. The method also includes exposing the metal foil to a laser beam, wherein exposing the metal foil to the laser beam forms openings in the intervening layer and forms a plurality of conductive contact structures electrically connected to portions of the substrate exposed by the openings.

13 Claims, 17 Drawing Sheets

Related U.S. Application Data which is a continuation-in-part of application No. 16/376,802, filed on Apr. 5, 2019, now Pat. No. 11,362,220.

(60) Provisional application No. 62/773,172, filed on Nov. 29, 2018, provisional application No. 62/773,168, filed on Nov. 29, 2018, provisional application No. 62/773,148, filed on Nov. 29, 2018, provisional application No. 62/654,198, filed on Apr. 6, 2018.

(51) Int. Cl.
*H01L 31/0216* (2014.01)
*H01L 31/0224* (2006.01)
*H01L 31/0236* (2006.01)

(52) U.S. Cl.
CPC .. *H01L 31/02168* (2013.01); *H01L 31/02363* (2013.01); *H01L 31/1804* (2013.01)

(56) References Cited

U.S. PATENT DOCUMENTS

| | | | |
|---|---|---|---|
| 2002/0159740 A1 | 10/2002 | Beall et al. | |
| 2015/0090329 A1* | 4/2015 | Pass | H01L 31/022441 438/98 |
| 2015/0129031 A1* | 5/2015 | Moslehi | H01L 31/022441 438/98 |
| 2015/0179865 A1* | 6/2015 | Moors | H01L 31/022441 438/98 |
| 2016/0133759 A1* | 5/2016 | Pass | H01L 31/022441 438/98 |
| 2017/0062633 A1* | 3/2017 | Carlson | H01L 31/022441 |
| 2017/0179312 A1 | 6/2017 | Kim et al. | |

OTHER PUBLICATIONS

Nekarda, et al., "Laser-Based Foil Metallization for Industrial Perc Solar Cells," Presented at the $28^{th}$ European Photovoltaic Solar Energy Conference and Exhibition; Paris, Sep. 30-Oct. 2013, 3 pgs.

Graf, et al., "Foil Metallization Process for Perc Solar Cells Towards Industrial Feasibility," Presented at the $31^{st}$ European PV Solar Energy Conference and Exhibition, Sep. 14-18, 2015, Hamburg, Germany, 4 pgs.

Schulte-Huxel, et al., "Al-Foil on Encapsulant for the Interconnection of Al-Metalized Silicon Solar Cells," Article in IEEE Journal of Photovoltaics—Jan. 2013, 7 pgs.

Schulte-Huxel, et al., "Laser microwelding of thin Al layers for interconnection of crystalline Si solar cells: analysis of process limits for ns and µs lasers," Article in Journal of Photonics for Energy—Aug. 2014, 15 pgs.

Schulte-Huxel, et al., "Aluminum-Based Mechanical and Electrical Laser Interconnection Process for Module Integration of Silicon Solar Cells," in IEEE Journal of Photovoltaics, vol. 2, No. 1, pp. 16-21, Jan. 2012, 6 pgs.

* cited by examiner

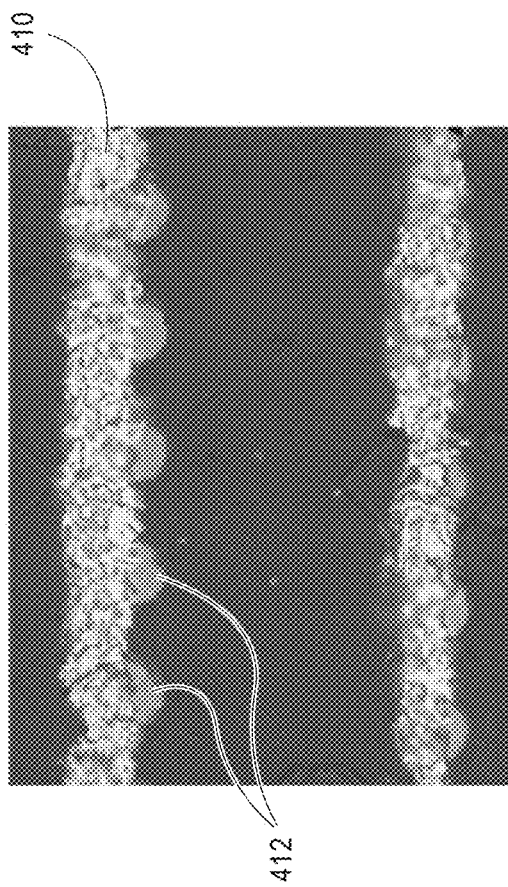
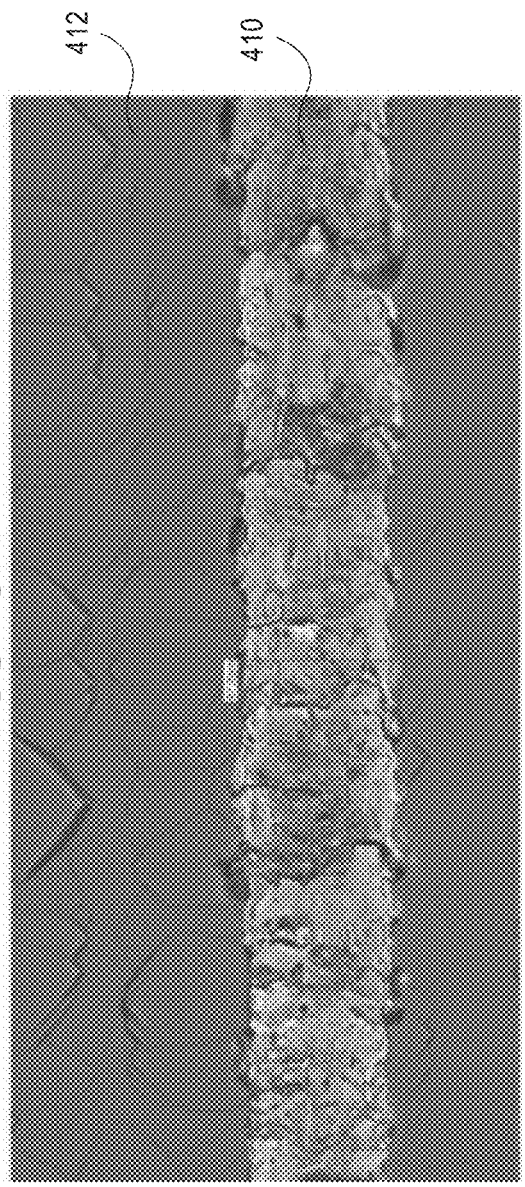
FIG. 8A
FIG. 8B

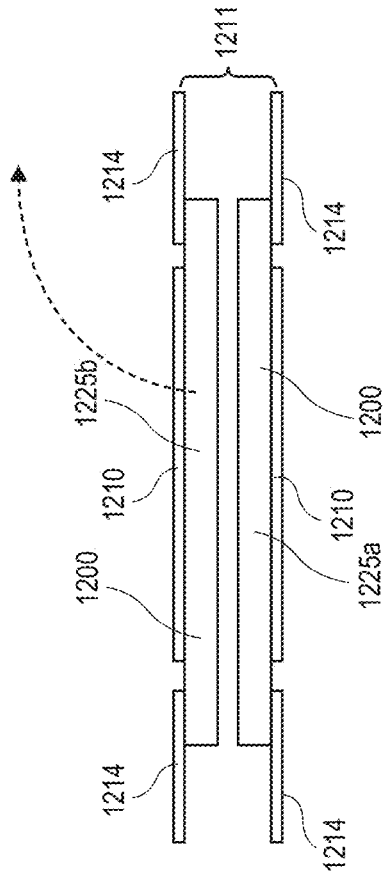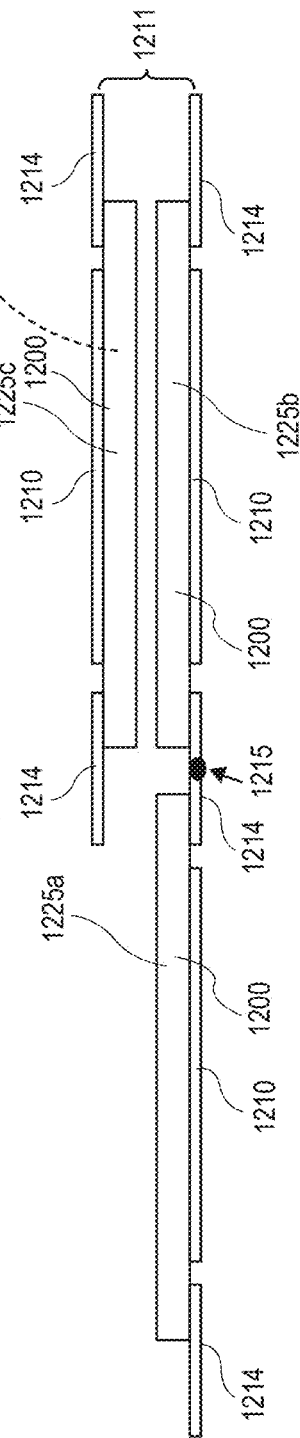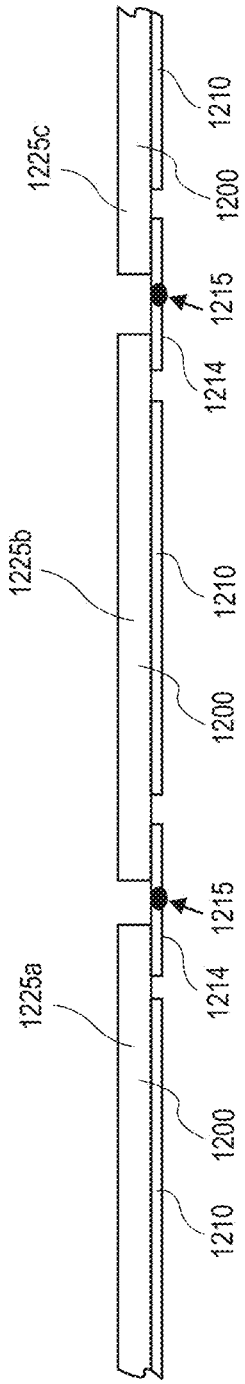

LOCAL PATTERNING AND METALLIZATION OF SEMICONDUCTOR STRUCTURES USING A LASER BEAM

CROSS REFERENCE TO RELATED APPLICATIONS

This application is a continuation of U.S. patent application Ser. No. 16/377,102, filed Apr. 5, 2019, which claims the right of priority to and benefit of earlier filing date of U.S. Provisional Application No. 62/773,172, filed on Nov. 29, 2018, U.S. Provisional Application No. 62/773,168, filed on Nov. 29, 2018, U.S. Provisional Application No. 62/773,148, filed on Nov. 29, 2018, and U.S. Provisional Application No. 62/654,198, filed on Apr. 6, 2018, each of which is hereby incorporated by reference herein in its entirety. This application also claims the right of priority to and benefit of earlier filing date of U.S. patent application Ser. No. 16/376,802, filed Apr. 5, 2019, titled "Local Metallization for Semiconductor Substrates using a Laser Beam,", SunPower Ref. No. S2040US, which is hereby incorporated by reference in its entirety.

TECHNICAL FIELD

Embodiments of the present disclosure are in the field of renewable energy or semiconductor processing and, in particular, include local metallization of substrates using a laser beam, and the resulting structures.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Electrical conversion efficiency is an important characteristic of a solar cell as it is directly related to the capability of the solar cell to generate power; with higher efficiency providing additional value to the end customer; and, with all other things equal, higher efficiency also reduces manufacturing cost per Watt. Likewise, simplified manufacturing approaches provide an opportunity to lower manufacturing costs by reducing the cost per unit produced. Accordingly, techniques for increasing the efficiency of solar cells and techniques for simplifying the manufacturing of solar cells are generally desirable.

BRIEF DESCRIPTION OF THE DRAWINGS

FIGS. 7A-7B and 8A-8B are digital images of various operations in a method of fabricating a solar cell.

FIGS. 12A-12C illustrate side views of operations in a method of fabricating a solar cell string.

DETAILED DESCRIPTION

Figure 1A:
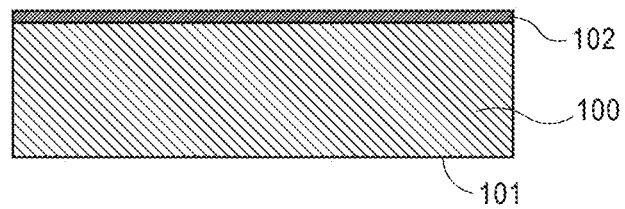
FIGS. 1A-1H illustrate cross-sectional views of various operations in a method of fabricating a solar cell.

The following detailed description is merely illustrative in nature and is not intended to limit the embodiments or the application and uses of such embodiments. As used herein, the word "exemplary" means "serving as an example, instance, or illustration." Any implementation described herein as exemplary is not necessarily preferred or advantageous over other implementations. Furthermore, there is no intention to be bound by any expressed or implied theory presented in the preceding technical field, background, brief summary or the following detailed description.

References to "one embodiment" or "an embodiment" do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Regions" or "portions" describe discrete areas, volumes, divisions or locations of an object or material having definable characteristics but not always fixed boundaries.

"Comprising" is an open-ended term that does not foreclose additional structure or steps.

"Configured to" connotes structure by indicating a device, such as a unit or a component, includes structure that performs a task or tasks during operation, and such structure is configured to perform the task even when the device is not currently operational (e.g., is not on/active). A device "configured to" perform one or more tasks is expressly intended to not invoke a means or step plus function interpretation under 35 U.S.C. § 112, (f) or sixth paragraph.

"First," "second," etc. terms are used as labels for nouns that they precede, and do not imply any type of ordering (e.g., spatial, temporal, logical, etc.). For example, reference to a "first" solar cell does not necessarily mean such solar cell is the first solar cell in a sequence; instead the term "first" is used to differentiate this solar cell from another solar cell (e.g., a "second" solar cell).

"Coupled" refers to elements, features, structures or nodes, unless expressly stated otherwise, that are or can be directly or indirectly joined or in communication with another element/node/feature, and not necessarily directly mechanically joined together.

"Inhibit" describes reducing, lessening, minimizing or effectively or actually eliminating something, such as completely preventing a result, outcome or future state completely.

"Exposed to a laser beam" describes a process subjecting a material to incident laser light, and can be used interchangeably with "subjected to a laser," "processed with a laser" and other similar phrases.

"Doped regions," "semiconductor regions," and similar terms describe regions of a semiconductor disposed in, on, above or over a substrate. Such regions can have an N-type conductivity or a P-type conductivity, and doping concentrations can vary. Such regions can refer to a plurality of regions, such as first doped regions, second doped regions, first semiconductor regions, second semiconductor regions, etc. The regions can be formed of a polycrystalline silicon on a substrate or as portions of the substrate itself.

"Thin dielectric layer," "tunneling dielectric layer," "dielectric layer," "thin dielectric material" or intervening layer/material refers to a material on a semiconductor region, between a substrate and another semiconductor layer, or between doped or semiconductor regions on or in a substrate. In an embodiment, the thin dielectric layer can be a tunneling oxide or nitride layer of a thickness of approximately 2 nanometers or less. The thin dielectric layer can be referred to as a very thin dielectric layer, through which electrical conduction can be achieved. The conduction can be due to quantum tunneling and/or the presence of small regions of direct physical connection through thin spots in the dielectric layer. Exemplary materials include silicon oxide, silicon dioxide, silicon nitride, and other dielectric materials.

"Intervening layer" or "insulating layer" describes a layer that provides for electrical insulation, passivation, and/or inhibits light reflectivity. An intervening layer can be several layers, for example a stack of intervening layers. In some contexts, the intervening layer can be interchanged with a tunneling dielectric layer, while in others the intervening layer is a masking layer or an "antireflective coating layer" (ARC layer). Exemplary materials include silicon nitride, silicon oxynitride, silicon oxide (SiOx), silicon dioxide, aluminum oxide, amorphous silicon, polycrystalline silicon, molybdenum oxide, tungsten oxide, indium tin oxide, tin oxide, vanadium oxide, titanium oxide, silicon carbide and other materials and combinations thereof. In an example, the intervening layer can include a material that can act as a moisture barrier. Also, for example, the insulating material can be a passivation layer for a solar cell. In an example the intervening layer can be a dielectric double layer, such as a silicon oxide ($SiO_x$), for example with high hydrogen content, aluminum oxide ($Al_2O_3$) dielectric double layer.

"Locally deposited metal" and "metal deposition" are used to describe forming a metal region by exposing a metal source to a laser that forms and/or deposits metal from the metal source onto portions of a substrate. This process is not limited to any particular theory or mechanism of metal deposition. In an example, locally deposited metal can be formed upon exposure of a metal foil to a laser beam that forms and/or deposits metal from the metal foil, such as all of the metal foil exposed to the laser beam, onto portions of a silicon substrate. This process can be referred to as a "Laser Assisted Metallization Patterning" or LAMP technique. The locally deposited metal can have a thickness of 10 nm to 10 microns, a width approximately defined by the laser beam size, and physical and electrical properties matching those of the source metal foil.

"Patterning" refers to a process of promoting separation or separating portions of a source metal, and can specifically refer to weakening a region of a metal foil that is between a bulk of the metal foil and a deposited region of the metal foil (i.e., the deposited metal). This patterning can be the result of heat, perforation, deformation or other manipulation of the metal foil by the same laser process, LAMP, that deposits a metal foil onto a substrate, and can promote removal of the bulk of the metal foil (i.e., the non-deposited metal foil) from the resulting device. Unless expressed otherwise, references to LAMP includes such patterning.

"Substrate" can refer to, but is not limited to, semiconductor substrates, such as silicon, and specifically such as single crystalline silicon substrates, multi-crystalline silicon substrates, wafers, silicon wafers and other semiconductor substrates used for solar cells. In an example, such substrates can be used in micro-electronic devices, photovoltaic cells or solar cells, diodes, photo-diodes, printed circuit boards, and other devices. These terms are used interchangeably herein. A substrate also can be glass, a layer of polymer or another material.

"About" or "approximately". As used herein, the terms "about" or "approximately" in reference to a recited numeric value, including for example, whole numbers, fractions, and/or percentages, generally indicates that the recited numeric value encompasses a range of numerical values (e.g., +/−5% to 10% of the recited value) that one of ordinary skill in the art would consider equivalent to the recited value (e.g., performing substantially the same function, acting in substantially the same way, and/or having substantially the same result).

In addition, certain terminology can also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology can include the words specifically mentioned above, derivatives thereof, and words of similar import.

As described in further detail below, aspects of this disclosure relate to increased solar cell conversion efficiency and/or lower manufacturing costs by providing novel processes for fabricating solar cell structures.

Local patterning and metallization of substrate structures, for example semiconductor substrate structures, using a laser beam, and the resulting structures, e.g., metallized micro-electronic devices, semiconductor substrates and/or solar cells, are described herein. In accordance with one or more examples, a metal for a conductor contact is effectively deposited and patterned, and this process can be accomplished in a single operation with a laser. In an exemplary process, a metal foil (as a metal source) is placed over a surface of a substrate, such as a semiconductor solar cell, and portions of the metal foil are exposed to a laser beam to create localized heat for localized metal deposition while at the same time patterning the metal foil (the source metal layer).

After the deposition and patterning process, remnants of the source of the metal layer can be removed in a subsequent process. For example, portions of a metal foil that are not exposed to the laser beam are removed (i.e., non-deposited metal foil is removed). In a further example, portions of the metal foil are exposed to a subsequently applied laser beam, such as another laser beam and/or exposed to a laser having different properties (e.g., power, frequency, etc.). This subsequent processing can provide further patterning of the metal foil for purposes of removing the non-deposited metal foil. In certain implementations, a LAMP technique is repeated on a substrate in successive steps to form a metal layer on the substrate. In particular, a first foil is subjected to a first LAMP technique to form first conductive contact structures on first portions or regions of the substrate, and a second foil is subjected to a second LAMP technique on second portions or regions of the substrate. This second LAMP technique can occur after portions of the first foil that were not subjected to the first LAMP technique are removed, and the second portions or regions can be located on regions of the substrate where theses portions of the first foil were removed. Likewise, portions of the second foil that were not subjected to the second LAMP technique can be removed, and similar third, fourth, etc. LAMP techniques can be performed successively to form the metal layer on the substrate. This implementation can be used in an example where the to-be-removed portions of foil are difficult to remove due to shape or proximity to other features, such as metal features, on the substrate.

Not to be bound by theory, the above described localized metal deposition achieved by exposing a metal foil to a laser beam can be achieved by partial or full melt of the laser irradiated portions of the metal foil, by partial or full ablation of portions of the metal foil with subsequent re-deposition onto the wafer surface, and/or by laser sputtering of portions of a metal foil during laser deposition and patterning process of the metal foil. In an example, first portions of the metal foil are exposed to a laser beam and subsequently deposited on the wafer surface, while patterning the source metal foil layer at the same time. Additionally, certain implementations result in these first portions of the metal foil being fully or at least partially connected to adjacent second portions of the metal foil that have not been exposed to laser irradiation. A region of the metal foil between the first and second portions can have a relatively weakened physical structure (as compared to the second portions) that promotes separation of the second portions from the first portions to create discrete conductive paths.

In further examples, the above described local patterning and metallization process is performed in the presence of a non-patterned intervening layer or stack of intervening layers on a substrate or substrate feature. In a particular example, the intervening layer or stack is not subjected to a patterning process prior to positioning a metal foil on top of the intervening layer or stack, and in addition to patterning and locally depositing metal from a metal foil, the laser beam patterns the non-patterned intervening layer or stack of intervening layers in the same process operation. The laser process effectively ablates, opens or penetrates portions of the intervening layer or stack of intervening layers to create openings or points of penetration (collectively, "openings") in the intervening layer or stack of intervening layers. The laser also patterns an overlying metal foil from which metal is locally deposited into the openings in the intervening layer or stack of intervening layers at substantially the same time as, or effectively simultaneous with, creating the openings in the intervening layer or stack. In an exemplary implementation, an initial contact opening patterning process to form contact openings in the intervening layer or stack of intervening layers, prior to positioning a metal foil on top of the intervening layer or stack, is not necessary and avoided. In lieu of such a separate patterning process for the intervening layer, the intervening layer or stack of intervening layers is patterned during the same laser process used to pattern and deposit metal foil portions, such that openings in the intervening layer or stack of intervening layers are created in the very locations where metal is locally deposited onto a substrate using a single laser beam processing operation.

Not to be bound by theory, the above described process during which metal is locally deposited into openings in an intervening layer or stack of intervening layers at substantially the same time as, or effectively simultaneous with, creating the openings in the intervening layer or stack may be initiated with an onset of laser pulses. Initial laser pulses interact with a metal foil and cause portions of the metal foil exposed to laser pulses to establish a contact between the metal foil and the intervening layer at a side of the metal foil opposite the application of the laser pulses. Further laser pulses can drive the metal foil portions through the intervening layer to ultimately make electrical contact with a semiconductor or conductor region beneath the intervening layer. The end result can be referred to as a "simultaneous" opening formation (in the intervening layer) and local metal deposition (into the opening) even though the molecular process of achieving opening formation and local metal deposition in the openings can be more complex.

Examples described herein can involve use of a laser to deposit metal onto a solar cell from a source layer which is placed on top of the solar cell while patterning the source layer. In particular embodiments, a laser assisted metallization process involves use of a laser not only to deposit metal onto a solar cell from a layer of source metal which is placed onto the solar cell, but also to operate the laser at a region which generates enough peak power to ablate a dielectric layer, insulating layer or an intervening layer between the source metal and the receiving semiconductor substrate or layer.

Conventional metal deposition and patterning of a metal layer for a solar cell can include using a vacuum chamber for metal deposition or a chemical bath for metal plating. One or more patterning operations is also typically performed to identify regions where a deposited metal needs to be removed. In contrast, the disclosed metallization approaches effectively achieve metal deposition and patterning in a single process operation, eliminating or eliminating the need for previously required processes.

Several implementations discussed herein can provide less costly and faster metallization than using optical lithography (and omission of an associated etch process), and potentially more precise patterning with smaller feature width and higher aspect ratio compared to screen printing. LAMP techniques enable direct deposition and patterning of metal on a substrate using an inexpensive metal foil in a single operation process via a laser, and represents a significant cost advantage over competing technologies. LAMP techniques also enable the fabrication of relatively small features. Specifically, tighter pitch and higher efficiency can be achieved as compared with structures typically formed using screen printing. In an example, screen printed conductive contacts can include silver paste having a thickness of up to 50 microns and a minimum feature size of 50 microns. In contrast, LAMP techniques can result in a thickness of approximately 1 nanometer to 20 microns and a minimum feature size of approximately 25 microns. The deposition thickness can be controlled by the starting thickness of the source material and the laser conditions. The deposited thickness can range from about 5% to about 25% of the source material thickness. The thickness of the source material partially constrains the laser conditions (in particular, the pulse duration) required for LAMP. The thickness of the source material partially constrains the laser conditions (in particular, the pulse duration) required for LAMP. In one embodiment, a metal source material can have a thickness in a range of approximately 1 nm to 1 μm. In an example, performing laser assisted metallization process (LAMP) can include sputtering metal from a thin source material onto a thin polymer or membrane using a picosecond laser or a femtosecond laser, where the thin source material can have a thickness in a range of approximately 1 nm to 1 μm. In an embodiment, the metal source material can have a thickness in a range of 1 μm to 100 μm, such as 1 μm to 10 μm, 5 μm to 25 μm, 10 μm to 50 μm, 25 μm to 75 μm, or 50 μm to 100 μm. In an example, performing laser assisted metallization process (LAMP) can include sputtering metal from a metal foil onto a substrate using a picosecond laser or a femtosecond laser, where the metal foil can have a thickness in a range of approximately 1 μm to 100 μm. In various implementations of the LAMP techniques disclose parameters for pre- and post-LAMP metal thickness are as described in Table 1.

In another example, an operation to form metal and pattern a metal layer for a semiconductor device (e.g., a solar cell) can include first forming a first metal layer on a substrate (e.g., a metal seed layer) via conventional or LAMP techniques, locating a second metal layer (such as an aluminum foil) over the first metal layer, and bonding portions of the first metal layer to the second metal layer, e.g., using a laser. The metal seed layer can include a layer of deposited tin, tungsten, titanium, copper, and/or aluminum. A sputtering process can be used to deposit the metal seed layer. The metal seed layer can have a thickness in a range of 0.05 to 50 microns.

LAMP techniques are applicable for interdigitated back contact (IBC) solar cells and other types of solar cells, including: continuous emitter back contact solar cells, front

TABLE 1

| | Pre-LAMP Foil Thickness | Post-LAMP Foil Thickness: Single Foil | Post-Processing Foil Thickness: One layer of a Foil Stack | Post-Processing Foil Thickness: Total of all layers of a Foil Stack (a LAMP layer and additionally bonded layers) |
|---|---|---|---|---|
| Target Thickness Examples | 10-50 μm | 1-10 μm in LAMP region | 1-10 μm for initial LAMP layer | 10-50 μm |
| | | 1-20 μm in LAMP region | 1-20 μm for initial LAMP layer | 25-45 μm |
| | | 10-50 μm or original thickness in non-LAMP region | 10-50 μm for additionally bonded layers | 25-200 μm |
| | | | 20-200 μm for additionally bonded layers | 10-220 μm |
| Practical Minimum Thickness Examples | 1 μm | 60 nm | 100 nm | 100 nm |
| | | 100 nm | 1 μm | |
| Practical Maximum Thickness Examples | 100 μm | 12 μm | 20 μm | N/A |
| | | 20 μm | 200 μm | |

Other advantages include providing a feasible approach to replace the use of silver with less costly aluminum (in the form of an aluminum foil) for metallization of semiconductor features. Furthermore, the aluminum deposited with a LAMP technique can be a pure, monolithic metal, in contrast to screen printed silver, which has higher electrical resistance due to its porosity. In addition to the examples of Table 1, in various examples utilizing aluminum as a metal foil, the solar cell can have a layer (or layers) of aluminum with a thickness of approximately 1 nm-500 μm. The metal foil can include aluminum in an amount greater than approximately 97% and silicon in an amount approximately in the range of 0-2%.

An exemplary aluminum (Al) metal foil has a thickness approximately in the range of 1-100 μm, for example in the range of 1-15 μm, 5-30 μm, 15-40 μm, 25-50 μm 30-75 μm, or 50-100 μm. The Al metal foil can be a temper grade metal foil such as, but not limited to, F-grade (as fabricated), O-grade (full soft), H-grade (strain hardened) or T-grade (heat treated). The aluminum metal foil can be anodized or not, and can include one or more coatings. Multilayer metal foils can also be used. Exemplary metal foils include metal foils of aluminum, copper, tin, tungsten, manganese, silicon, magnesium, zinc, lithium and combinations thereof with or without aluminum in stacked layers or as alloys.

and/or back contact solar cells having a trench architecture (e.g., where doped regions are separated by a trench/gap or an intrinsic region), thin-film, Heterojunction with Intrinsic Thin layer (HIT) solar cells, Tunnel Oxide Passivated Contact (TOPCon) solar cells, organic solar cells, front contact solar cells, front contact solar cells having overlapping cells or sub-cells (e.g., shingled hypercell solar cells), Passivated Emitter and Rear Cell (PERC) solar cells, mono-PERC solar cells, Passivated Emitter with Rear Locally-Diffused (PERL) cells, 3 or 4 terminal tandem cells, laminates and other types of solar cells. LAMP techniques are also applicable for solar cells having a plurality of sub-cells coupled by metallization structures—sometimes referred to as a multi-diode structure. For example, a groove separates adjacent sub-cells and a metallization, such as foil, connects the adjacent sub-cells together. The groove can be formed by a laser scribe and subsequent cleave to singulate and physically separate one sub-cell from another, thereby forming one or more adjacent sub-cells from a common original solar cell. The metallization structure can physically and electrically connect the sub-cells, where the metallization structure can be located over the groove and span the gap formed by the groove.

An exemplary method of fabricating a solar cell includes forming an intervening layer, for example an anti-reflective coating (ARC) layer, on or above a substrate (on the front and/or back surface). A metal foil is located over the intervening layer, and in some examples cause the metal foil to appear to float over the substrate. The metal foil is exposed to a laser beam in locations in locations where metallization is to be formed. Exposing the metal foil to the laser beam forms openings in the intervening layer, and forms a plurality of conductive contact structures in the openings in a same process operation at substantially the same time or simultaneously. The plurality of conductive contact structures are electrically connected to underlying regions of the substrate, each conductive contact structure including a locally deposited metal portion that is in electrical connection with the substrate. In some examples, the conductive contact structures can be located on a back side, a front side or both the front and the back sides of the substrate. In an example, the substrate is a semiconductor substrate. In an example, the intervening layer is formed covering the entire surface, on and/or above, of the substrate. In an example, the intervening layer is formed only partially covering the surface, on and/or above, of the substrate.

One or more examples described herein can involve operation of a laser at a suitable pulse energy for implementing a laser assisted metallization patterning, with particular laser parameter tuning to further provide for dielectric layer laser ablation, laser doping, or localized crystallization. The implementation that provides for further dielectric ablation can alleviate a separate dielectric layer patterning operation, since the dielectric is effectively patterned during the same laser process as implemented for laser assisted metallization and can be simultaneous.

An exemplary metal foil is a continuous sheet of metal that can cover the entire substrate, including over the intervening layer, and extend past all of the edges of the substrate. In another example, the metal foil covers only the substrate, or only a portion of the substrate, such only the intervening layer or only a portion of the intervening layer. In this example, the metal foil can be relatively narrow in width and considered a metal ribbon. For the purposes of this disclosure a metal ribbon is considered a metal foil.

Solar cells can include a patterned backsheet, encapsulant and/or colored (pigmented) back encapsulants. The metal foil can be hidden using a masking or cloaking material, such as a tape, that is placed between an edge of the solar cell and the metal foil, in a gap region between adjacent solar cells (spanning the gap there between). The metal foil can also be anodized or otherwise colored to match the solar cell so that it is not readily visible or distinguishable from the solar cell when viewed from the front (i.e., the metal foil is masked or cloaked). The metal foil can also include an adhesive, for example, to adhere the metal foil to the substrate for pre-LAMP processing and/or post-LAMP processing. Alternatively or in addition to, the substrate includes an adhesive to secure the metal foil pre-LAMP processing and/or post-LAMP processing. A dielectric material, for example, a damage buffer material (DBM), or oxide material can also be disposed between the substrate and the metal foil.

A locating process can be performed to position or secure the metal foil to a substrate using a vacuum and/or a tacking process to hold the metal foil in place over/on the substrate. The locating process can include thermocompression, where a roller and/or heat can be used to position or locate the metal foil over the substrate. A vacuum process, thermocompression process or other similar process can also be used to uniformly position the metal foil and inhibit air gaps or air pockets between the metal foil and the substrate.

In an example, the power, wavelength and/or pulse duration of a laser for a LAMP technique are selected so as to form a plurality of locally deposited metal portions, but not to fully ablate the foil. The power, wavelength and/or pulse duration can be selected/tuned based on the metal foil composition, melting temperature and/or thickness. In an example, the laser has a wavelength of between about 250 nm and about 2000 nm (such as wavelength of 250 nanometers to 300 nanometers, 275 nanometers to 400 nanometers, 300 nanometers to 500 nanometers, 400 nanometers to 750 nanometers, 500 nanometers to 1000 nanometers, 750 nanometers to 1500 nanometers, or 1000 nanometers to 2000 nanometers), the laser peak power is above $5 \times 10^{+4}$ $W/mm^2$, and the laser is a pulse laser with a pulse frequency of about 1 kHz and about 10 MHz (such as about 1 kHz and about 10 MHz, such a 1 kHz to 1000 kHz, 500 kHz to 2000 kHz, 1000 kHz to 5000 kHz, 2000 kHz to 7500 kHz, or 5000 kHz to 10 mHz. The pulse duration can be between 1 fs to 1 ms, such as 1 fs to 250 fs, 100 fs to 500 fs, 250 fs to 750 fs, 500 fs to 1 ns, 750 ns to 100 ns, 1 ns to 250 ns, 100 ns to 500 ns, 250 ns to 750 ns, 500 ns to 1000 ns, 750 ns to 1500 ns, 1000 ns to 5000 ns, 1500 ns to 10000 ns, 5000 ns to 100000 ns, 10000 ns to 500000 ns, and 100000 to 1 ms. The laser can be an IR, Green or a UV laser. In certain examples, the laser beam has a width of between about 20 and about 50 μm, such as 20-30 μm, 25-40 μm, and 30-50 μm.

In an example, non-locally deposited portions of the metal foil are removed, which can result in the locally deposited portions of the metal foil having an edge feature, such as an edge feature formed by physically separating, breaking or tearing the bulk metal foil that was not subjected to a LAMP technique, from the portions of the metal foil that are deposited on the substrate. The edge feature can include a torn edge or a sharp torn edge. In an example, first portions of the metal (aluminum foil in this example) are deposited or directly secured to the surface of the solar cell by a LAMP technique, whereas second portions (which are adjacent to the first portions) of the metal are not subjected to a LAMP technique and are not deposited or directly secured to the surface of the solar cell. The first and second portions of the metal foil are attached to each other, and a region there between can be patterned to weaken this region, preferably the same LAMP technique in a same process step that deposited the first portions. The second portions are removed and physically separated or torn away from the first portions, resulting in an edge structure along sides of the first portions. This edge structure or feature can be sharp and/or torn in appearance, and is differentiated from a round or curved edge of a metallization feature left behind from welding, soldering, plating or other depositions of metal to a substrate. The edge structures can also be polished to remove sharp or rough features in a subsequent step.

Exposing foil to a laser beam can also form other features that are unique when compared to conventional metallization approaches, including forming a "U-shaped" structure or valley where the laser beam has contacted the foil. The width of the "U-shaped" is approximately equal to the width of the laser beam used. In an embodiment, the conductive contact structures are connected, at least temporarily until the removal of the regions not exposed to the laser beam, by edge portions that extend from the conductive contact structure to regions of the metal foil not exposed to the laser beam.

In an example, exposing the metal foil to the laser beam forms a spatter or sputter feature on the solar cell, for example on the foil and/or substrate. Such a spatter feature can be used to determine if the solar cell was formed using a LAMP technique. In some examples, the spatter feature can be removed from at least the metal foil, for example, to facilitate bonding of a second material to the foil, such as a carrier sheet used to remove the foil that has not been exposed to the laser beam, or other components of a solar cell, solar cell string, or higher order structure, such as an interconnect, foil extending from another cell, or other electrically or non-electrically connected component of a solar cell, solar cell string, or higher order structure. Such spatter can be removed by polishing or etching.

Laser assisted metallization can be repeated to build up a multi-layer metal foil structure for purposes of increased metal thickness (e.g., for conductivity or structural purposes) and to facilitate removal of non-deposited portions of a first metal foil layer. Specifically, a second metal source, such as a metal foil, wire, or tape can be located over a first metal foil, where the second metal source can be subjected to a laser beam in selected locations over positions of the first metal foil that are not locally deposited (i.e., directly electrically connected) to semiconductor regions, thereby welding or bonding the second metal source to the first metal foil. Subsequent mechanical removal of the second metal source thereby selectively removes regions of the first metal foil that are not locally deposited to semiconductor regions on the substrate.

Additionally, the second metal source is used to provide additional metallization thickness to an entire or portions of a solar cell, such as for the construction of busbars where additional metal thickness is beneficial for electric conduction. Here, the second metal source can be bonded to the first metal foil, via a laser, at the selected locations over positions of the first metal foil that are not locally deposited and/or the same or approximately the same positions that the first metal foil is locally deposited to the semiconductor regions. This process can be restricted to interconnection regions between adjacent solar cells or applies across a string of adjacent solar cells.

Additionally, the second metal source is located over the solar cell substrate which includes regions or portion of localized metallization, such as formed from a first metal foil or by conventional metallization techniques. The second metal source is bonded to the localized metallization in selected regions to provide additional metallization in these selected regions. In an example, the second metal source is patterned to both increase metal thickness in some regions and to be used as a carrier sheet to remove non-locally deposited portions of the first metal foil in other regions. A tacking process can be used to bond a second metal source to a first metal foil. A tacking process involves forming an array of point or spot welds, which can be performed using a laser, thermocompression bonding (e.g., by using spikes, a spiked roller, a porcupine roller, or a bed of nails), or conventional soldering and welding techniques. The second metal source can also be bonded to the first foil using an electrically conductive adhesive. In another embodiment, the carrier is a plastic, polymer, and/or membrane, that can be used as an insulator, moisture barrier, protection layer and the like.

As described above, with the appropriate laser conditions, a laser assisted metallization process (LAMP) is implemented to deposit metal and create openings in a dielectric layer at effectively the same time, e.g., in a same laser process operation. Such a process can enable removal of a separate contact opening operation, such as a laser contact patterning operation separate from a metallization process, reducing capital costs. Furthermore, such an approach can reduce otherwise stringent alignment requirements of a LAMP process that is performed in alignment with preformed contact openings, allowing for increased yield and/or finer pitch. In an exemplary processing scheme, FIGS. 1A-1D illustrate cross-sectional views of various operations in a method of fabricating a solar cell.

Referring to FIG. 1A, an intervening layer 102 is formed on or above a solar cell substrate 100. While particular reference is made to forming the intervening layer on or above the substrate it is appreciated that the direction above is relative and that this intervening layer can be formed on the back, the front, or even the back and the front, of a selected substrate, for example, for metallization of the front, back, or both the front and back of the substrate.

In an example, intervening layer 102 is a single intervening layer. In one such example, the single intervening layer is a layer of material such as, but not limited to, silicon nitride (SiNx), silicon oxynitride (SiONx), silicon dioxide (SiO$_2$), aluminum oxide (AlOx), amorphous silicon (a-Si), polycrystalline silicon (poly-Si), molybdenum oxide (MoOx), tungsten oxide (WOx), indium tin oxide (ITO), vanadium oxide (V$_2$Ox), titanium dioxide (TiO$_2$), or silicon carbide (SiC). In another example, intervening layer 102 is a stack of intervening layers, such as a stack of two or more of the above such materials.

In an example, solar cell substrate 100 is a front contact, perc or perl solar cell substrate, and intervening layer 102 is a layer or stack such as, but not limited to, SiNx/SiO$_2$, SiNx/AlOx/SiO$_2$, SiNx, SiONx, SiNx/SiONx, SiNx/SiONx/AlOx/SiO$_2$, SiNx/SiONx/SiO$_2$, or AlOx/SiO$_2$. In an example, solar cell substrate 100 is a HIT solar cell substrate, and intervening layer 102 is a layer or stack such as, but not limited to, a-Si, a-Si/SiO$_2$, SiNx/a-Si/SiO$_2$. In an example, solar cell substrate 100 is a selective carrier contact, or thin film solar cell substrate, and intervening layer 102 is a layer or stack such as, but not limited to, poly-Si, MoOx/SiO$_2$, WOx/SiO$_2$, ITO/a-Si or doped a-Si, doped poly-Si, MoOx/a-Si/SiO$_2$, V$_2$Ox/a-Si/SiO$_2$, TiO$_2$, or SiC.

In an example, intervening layer 102 is formed on a backside of substrate 100 opposite a light-receiving side 101 of the substrate 100. In an example, not shown, the light receiving surface 101 can have a texturized light-receiving surface. In one example, a hydroxide-based wet etchant is employed to texturize the light receiving surface 101 of the substrate 100. In an example, a texturized surface can be one which has a regular or an irregular shaped surface for scattering incoming light, decreasing the amount of light reflected off of the light receiving surface 101 of the solar cell. Additional examples can include formation of a passivation and/or insulating (ARC) layers on the light-receiving surface 101.

While this disclosure is primarily directed to back-contact solar cells, the methods and techniques discussed herein, and specifically the LAMP techniques, can be applied to the metallization of a substrate in other solar cell types, such as front contact solar cells (e.g., PERC solar cells, mono-PERC solar cells, HIT solar cells, TopCon solar cells, (PERL) cells, and tandem cells, and other types of solar cells).

In an example, intervening layer 102 is formed over a plurality of N-type and P-type semiconductor regions formed in or above the substrate 100. In an example, substrate 100 is a monocrystalline silicon substrate, such as a bulk single crystalline N-type doped silicon substrate. It is to be appreciated, however, that substrate 100 can be a layer, such as a multi-crystalline silicon layer, on a global solar cell substrate. In one example, substrate 100 has therein N-type doped regions and P-type doped regions, which are covered by intervening layer 102.

In accordance with an example, substrate 100 has there above N-type semiconductor regions and/or P-type semiconductor regions, which are covered by intervening layer 102. The N-type semiconductor regions and P-type semiconductor regions can be on a dielectric layer. In an example, the N-type semiconductor regions and P-type semiconductor regions can be on dielectric layer including a thin dielectric material as an intervening material between the N-type semiconductor regions or P-type semiconductor regions, respectively, and the substrate 100. In an example, the thin dielectric layer is a tunneling silicon oxide layer having a thickness of approximately 2 nanometers or less. In one such example, the dielectric layer can be referred to as a very thin dielectric layer or a "tunneling" dielectric layer, through which electrical conduction can be achieved. The conduction can be due to quantum tunneling and/or the presence of small regions of direct physical connection through thin spots in the dielectric layer. In one example, the tunneling dielectric layer is or includes a thin silicon oxide layer. In an example, the N-type and P-type semiconductor regions are formed from polycrystalline silicon formed by, e.g., using a plasma-enhanced chemical vapor deposition (PECVD) process. In one such example, the N-type polycrystalline silicon emitter regions are doped with an N-type impurity, such as phosphorus. The P-type polycrystalline silicon emitter regions are doped with a P-type impurity, such as boron. In an example, the N-type and P-type semiconductor regions are separated from one another. In an example, the N-type and P-type semiconductor regions have trenches formed there between, the trenches extending partially into the substrate, and covered by intervening layer 102. In one example, N-type and P-type semiconductor regions are separated by a lightly doped region there between, e.g., where the lightly doped regions can have a doping concentration substantially less than the N-type and P-type semiconductor regions.

Figure 1B:
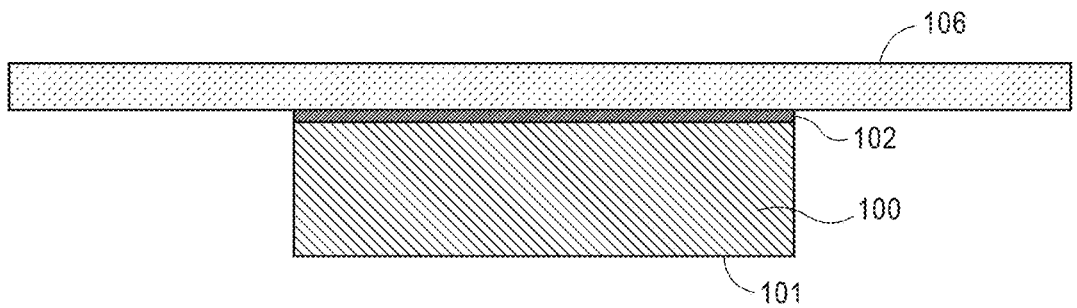

Referring to FIG. 1B, a metal foil 106 is located over the intervening layer 102. In an example, locating the metal foil 106 over the intervening layer can include positioning the metal foil over the substrate 100. In an example, positioning the metal foil 106 over the substrate 100 includes covering the entire substrate 100. In an example, portions of the metal foil 106 can be located over the substrate 100 and other portions can be located away, e.g., extend away from the substrate 100 in a lateral direction as shown in FIG. 1B. In an example, in order to secure the metal foil 106 with the substrate 100, a locating process can be performed, including using a vacuum and/or a tacking process to hold the metal foil 106 in place over the substrate 100. In an example, the locating process includes performing a thermocompression process. In further example, a roller can be used to position or locate the metal foil 106 over the substrate 100. In an embodiment, the vacuum process, thermocompression process or other similar process can uniformly position the metal foil to inhibit air gaps or pockets of air between the metal foil and the substrate, as shown. In an example, a roller can be used to uniformly position the metal foil 106 over the substrate 100.

At the time of locating the metal foil 106 over the substrate 100, the metal foil 106 has a surface area substantially larger than a surface area of the solar cell. In another example, however, prior to placing the metal foil 100 over the solar cell, a large sheet of foil is cut to provide the metal foil 106 having a surface area substantially the same as a surface area of the substrate 100. The metal foil can be laser cut, water jet cut, and the like, for example, prior to or even after placement on or above the substrate.

In an example, the metal foil 106 is an aluminum (Al) foil having a thickness approximately in the range of 5-100 microns. In one example, the Al foil is an aluminum alloy foil including aluminum and second element such as, but not limited to, copper, manganese, silicon, magnesium, zinc, tin, lithium, or combinations thereof. In one example, the Al foil is a temper grade foil such as, but not limited to, F-grade (as fabricated), O-grade (full soft), H-grade (strain hardened) or T-grade (heat treated). In one example, the aluminum foil is an anodized aluminum foil. In another example, the aluminum foil is not anodized.

Figure 1C:
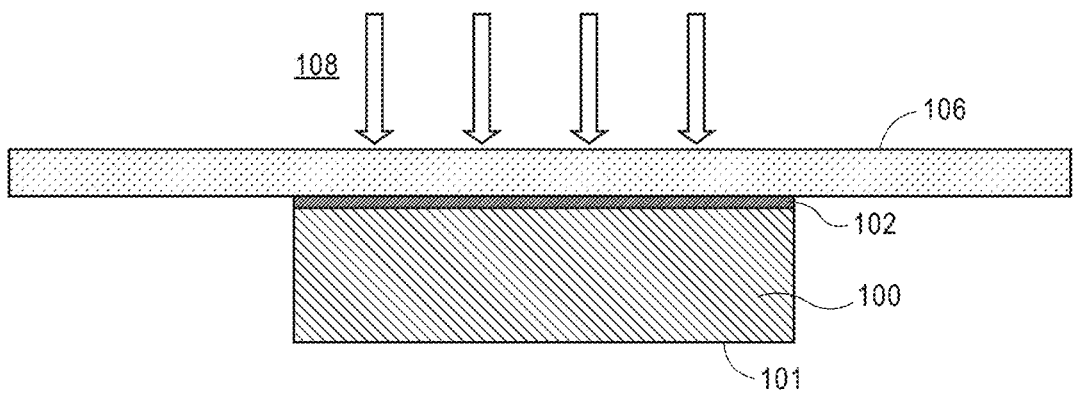

Referring to FIG. 1C, the metal foil 106 can be exposed to a laser beam 108 in locations where metallization is to be formed.

Figure 1D:
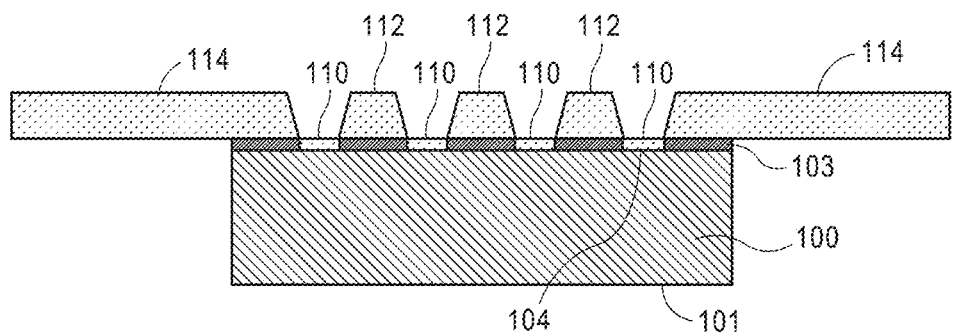

Referring to FIG. 1D, exposing the metal foil 106 to the laser beam 108 forms ablates portions of the intervening layer 102 to form intervening layer 103 having openings 104 therein. The openings 104 are formed in locations beneath the laser beam 108. Exposing the metal foil 106 to the laser beam 108 further forms a plurality of conductive contact structures 110 in the openings 104. The plurality of conductive contact structures 110 is electrically connected to the plurality of N-type and P-type semiconductor regions in or above the substrate 100.

In accordance with one or more embodiments of the present disclosure, each conductive contact structure 110 is or includes a locally deposited metal portion. In one such example, metal foil 106 acts as source or metal and is referred to as a local source since the metal foil 106 is first placed on a substrate surface. The metal foil 106 is then exposed to a laser process, e.g., exposure to a laser beam, that both forms openings 104 to form a patterned intervening layer 103 and deposits metal from the metal foil 106 (metal source) onto portions of the substrate exposed by openings 104 in patterned intervening layer 103. It is to be appreciated that the resulting locally deposited metal portions can have an edge feature which can be distinguished from metal structure formed by other deposition processes such as plating which can provide conformal structures absent an edge feature.

Figure 1E:
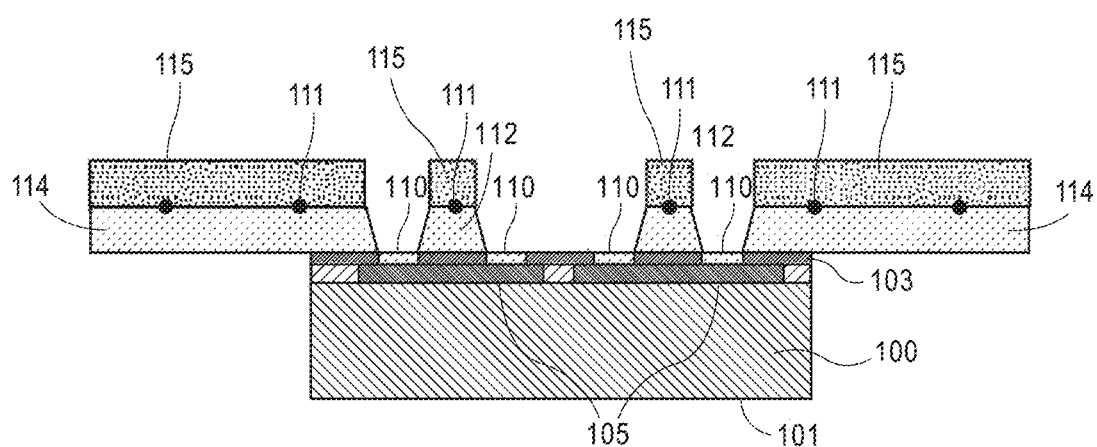

Referring again to FIG. 1D, second portions or portions 112 and 114 of the metal foil 106 not exposed to the laser beam 108 are retained on the patterned intervening layer 103. The portions 112 are central portions, while the portions 114 are edge portions and can be overhang portions, as is depicted. In certain implementations, such second portions are not deposited or secured to the solar cell or the patterned intervening layer 103. In an embodiment, the structure of FIG. 1D is implemented as a solar cell without removal of portions 112 and/or 114 of the metal foil 106. Such a structure can be used for a back surface metallization of a front contact solar cell. Additionally, a second metal source can be bonded/attached to the portions 112, 114 as shown in FIG. 1E. The overhang of edge portions 114 can be used for coupling to another solar cell to form a solar cell string, see for example FIG. 1F. It is to be appreciated that 114 in FIG. 1D can extend to the side of the wafer to connect to a busbar which is into or out of the page (e.g., considering 110, 112 extend into or out of the page and a busbar can be connected to those portions). With reference to again to FIGS. 1A-1F, the process described can be repeated with successive foils to form conductive contact structures on different portions of the substrate, such as a second, third, etc. portions or regions of the substrate, each of which is a discrete region on the substrate.

Referring to FIG. 1E, a second metal source 115 can be located over the substrate 100. The second metal source can include as a metal foil, wire, or tape. As shown, the second metal source 115 can be patterned, e.g., pre-patterned and located over portions 112, 114. In some examples, the second metal source 115 can be located as a sheet and patterned after placing it over the portions 112, 114. A bonding process can be performed to bond the second metal source to the portions 112, 114. In an example, the second metal source 115 can be subjected to a laser beam in selected locations over portions 112, 114, e.g., performing a welding process to bond 111 the second metal source 115 to the portions 112, 114. In some examples, attaching the second metal source 115 can include applying a conductive adhesive, tacking, stamping and/or any other similar attachment-type of processes to connect the second metal source 115 to the portions 112, 114. In an example, the second metal source 115 can be bonded 111 to both portions 112. In some examples, the second metal source 115 can be bonded 111 to portion 112 or 114. Also, in some embodiments, the second metal source can instead be located and/or bonded to the metal foil 106 of FIG. 1D.

Figure 1F:
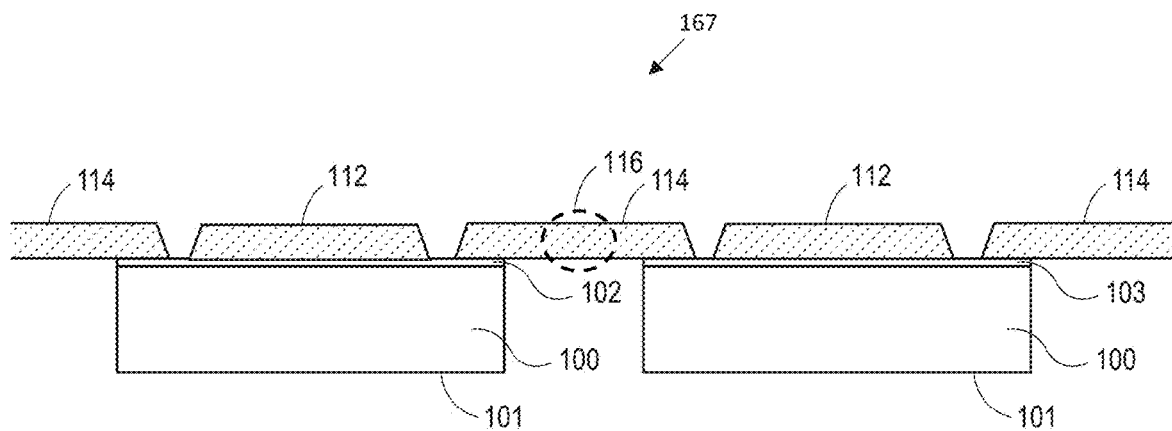

Referring to FIG. 1F, a side elevation view 90 degrees into the page from FIG. 1D, there is shown a solar cell string 167. As shown, the edge portions 114 can also be referred to as interconnect portions which can electrically connect one solar cell to another solar cell. In one example, coupling one solar cell to another solar cell in this manner can form a solar cell string, achieving a parallel or series electrical relationship between the cells. In a particular embodiment, the overhang portion can represent a foil portion that is sufficiently large to overlap with one or more additional cells for metallization of the one or more additional cells. In an example, a single piece and/or sheet of foil can be used for a plurality of solar cells (e.g., 2, 3 or more solar cells) in this manner. In an embodiment, two or more cells can be connected together by their respective edge portions 114. For example, the edge portions 114 from adjacent cells can be connected by various processes at 116, such as by bonding, e.g., welding, and/or including conventional and laser bonding, laser welding, thermocompression bonding, soldering processes, and the like. In another example, substrates 100 can have individual edge portions 114. These individual edge portions 114 can be bonded and/or welded together to electrically connect one substrate to another, e.g., to form a solar cell string. In some examples, the individual edge portions 114 can be attached together using a conductive adhesive, tacking process, stamping process and/or any other type of applicable attachment process.

Figure 1G:
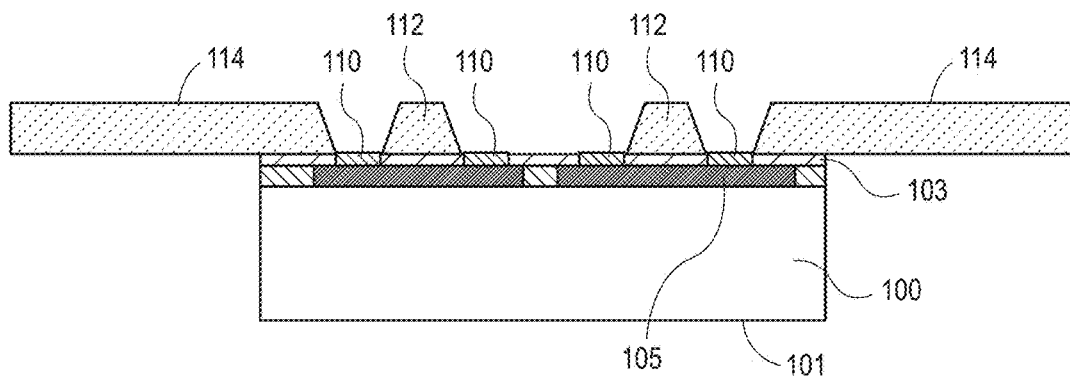

Referring to FIG. 1G, this figure schematically illustrates position of semiconductor regions 105. In an embodiment, as shown, the semiconductor regions can include a plurality of semiconductor regions such as first semiconductor regions, second semiconductor regions, etc. In an example, first semiconductor regions can be N-type semiconductor regions and the second semiconductor regions can be P-type semiconductor regions. In some examples, the semiconductor regions 105 can have the same conductivity type, e.g., are all N-type or P-type, as in some front contact solar cells. In an embodiment, the semiconductor regions 105 can include polycrystalline silicon. A thin dielectric layer, e.g., a tunnel oxide layer, can be disposed between the semiconductor regions 105 and the substrate 100.

As illustrated in FIG. 1G, the semiconductor regions 105 are separated from one another laterally by a region 119. This region 119 can be a gap, an intrinsically doped region or a lightly doped region. Two openings in the intervening layer 103 for each of the semiconductor regions 105 are shown for connecting the conductive contact structures 110 to the semiconductor regions 105. The portions 112 electrically connect the conductive contact structures 110 for each of the semiconductor regions 105. In other words, the portion 112 on the left electrically connects the two left-most conductive contact structures 110 while the portion 112 on the right electrically connects the two right-most conductive contact structures 110. In a specific example, the semiconductor regions 105 are N-type and/or P-type semiconductor regions and are separated by trenches formed there between, the trenches extending partially into the substrate, and covered by an intervening layer 103. The separation can also be achieved by a lightly doped region 119, where the lightly doped regions can have a doping concentration substantially less than the N-type and/or P-type semiconductor regions. However, the semiconductor regions 105 can have the same conductivity type, are all N-type or P-type, as in some front contact solar cells. The portions 114 are edge portions and can be overhang portions, which can be used for coupling to another solar cell.

Figure 1H:
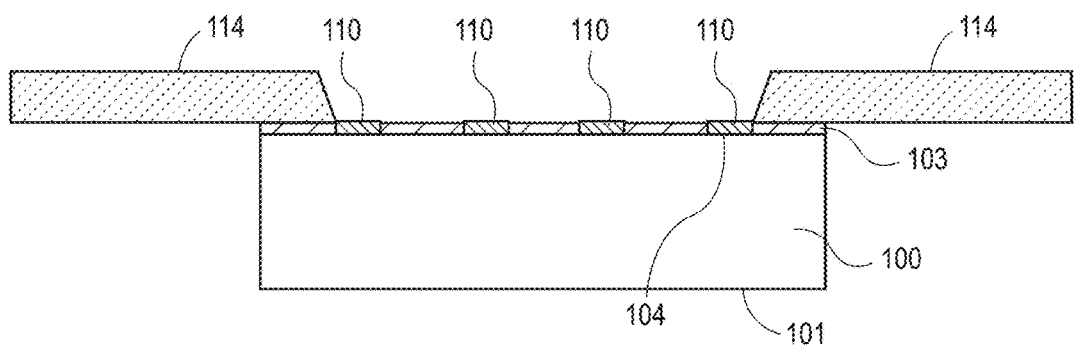

Referring to FIG. 1H this figure schematically illustrates position of semiconductor regions 104. In an embodiment, as shown, the semiconductor regions 104 can include portions of the substrate 100 itself. Similar to FIG. 1G, the semiconductor regions 104 can include a plurality of semiconductor regions: first semiconductor regions, second semiconductor regions, etc. which can be N-type semiconductor regions and P-type semiconductor regions. In some examples, the semiconductor regions 104 can have the same conductivity type, e.g., are all N-type or P-type, as in some front contact solar cells.

Referring again to FIGS. 1G and 1H, a second metal source can be bonded and/or attached to the portions 112, 114. The second metal source can include as a metal foil, wire, or tape. In an example, the bond and/or attachment can include a weld, laser, weld, conductive adhesive, tack, stamp and/or any other similar bond/attachment.

Figure 13:
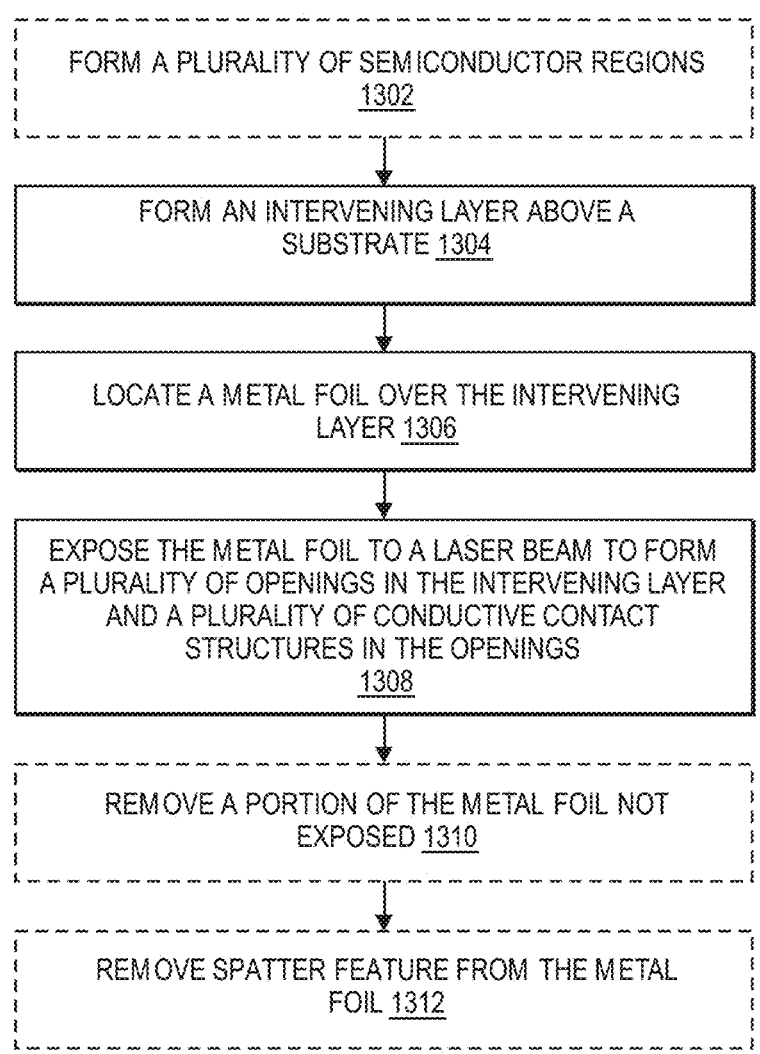
FIG. 13 illustrates an exemplary work flow for constructing a solar cell.

FIG. 13 is a flowchart 1300 representing various operations in a method of fabricating a solar cell. Optionally, at operation 1302, a plurality of semiconductor regions are formed in or above the substrate. At operation 1304, an intervening layer is formed above a substrate. The intervening layer can be referred to as an insulating or passivating layer. It is to be appreciated that operation 1304 can be optional since, in some embodiments, a substrate is provided already having the intervening layer formed thereon. At operation 1306, a metal foil is located over the intervening layer.

At operation 1308, the metal foil is exposed to a laser beam to form a conductive path between the metal foil and the substrate or the semiconductor regions in or above the substrate, through the intervening layer. In an example, by exposing the metal foil to the laser beam, a plurality of openings in the intervening layer are formed to expose portions the underlying substrate or semiconductor regions in or above the substrate, and a plurality of conductive contact structures are formed in the openings to electrically connect to the exposed portions of the substrate or semiconductor regions. These openings are distinguishable over the circular openings formed in a conventional Laser Contact Opening (LCO) technique, where a laser performs laser ablation of a passivation layer on a solar cell. In another example, by exposing the metal foil to the laser beam, metal from the metal foil penetrates through portions of the intervening layer to form conductive contact structures that electrically connect the metal to portions of the substrate or semiconductor regions that are under the penetrated portions of the intervening layer.

In an embodiment, a structure resulting from performing operation 1308 includes a substrate including a semiconductor region. A continuous intervening layer is on the substrate and covers the semiconductor region. A metal (e.g., a metal foil) is caused to penetrate through the intervening layer, by a LAMP technique, to electrically connect to the semiconductor region without passing through a contact hole previously formed in the intervening layer. By exposing the metal to a laser in a location over a portion of an intervening layer (as opposed to a location over a previously formed opening or hole in an intervening layer), a portion of the materials of the metal foil penetrates into the intervening layer. This process is in contrast to a process in which contact openings are formed in a process prior to metal foil laser exposure, e.g., by a LCO technique or a process in which contact openings are etched into or laser ablated into an intervening layer prior to providing the metal foil over the substrate and intervening layer. Not to be bound by theory, exposing the metal foil to a laser at a location over a portion of an intervening layer causes a material interaction, interconnection, combination, mixing and/or penetration to occur between the material of the intervening layer and the material of the foil to provide a diffused conductive material and conductive path within and through the intervening layer. As a result, in one embodiment, the diffuse conductive material is not a pure metal but is effectively a contamination region including metal from the metal foil contaminated with material from the intervening layer. Nonetheless, the resulting structure can be used as a conductive contact, as described herein.

In one embodiment, exposing the metal foil to the laser beam further forms the plurality of conductive contact structures electrically connected to the portions of the substrate by diffusing atoms of the metal foil into the portions of the substrate beneath the plurality of conductive contact structures.

In one embodiment, the intervening layer further includes an amorphous semiconductor layer, exposing the metal foil to the laser beam forms the plurality of conductive contact structures electrically connected to the portions of the substrate and crystallizes portions of the amorphous semiconductor layer beneath the plurality of conductive contact structures.

Optionally or in addition to, at operation 1310, at least a portion of the metal foil not exposed to the laser beam is removed. Optionally or in addition to, at operation 1312 the spatter feature is removed from the metal foil not exposed to the laser beam. The operation 1312 can be performed prior to operation 1310. The operations described above can be repeated, for example with successive foils.

It is to be appreciated that, although many examples focus on patterning an intervening layer and a metal foil at substantially the same time in a same laser process, some examples described herein can involve patterning of a metal foil in locations where in intervening layer already has openings formed therein, or can involve patterning of a metal foil over a semiconductor substrate or layer that does not include an intervening layer thereon. In one such example, exposing the metal foil to the laser beam includes using a pulse energy in the range of 250-300 microJoules, e.g., between 250-270 microJoules, between 260-280 microJoules, between 270-290 microJoules, or between 280-300 microJoules, and a pulse duration in the range of 50-70 nanoseconds, e.g., between 50-60 nanoseconds, between 55-65 nanoseconds, or between 60-70 nanoseconds. In an example, each conductive contact structure includes a locally deposited metal portion.

In other examples, as described herein, an intervening layer and a metal foil are patterned at substantially the same time in a same laser process. In one such example, exposing the metal foil to the laser beam includes using a pulse energy in the range of 200-350 microJoules, e.g., between 200-220 microJoules, between 210-230 microJoules, between 220-240 microJoules, between 230-250 microJoules, between 240-260 microJoules, between 250-270 microJoules, between 260-280 microJoules, between 270-290 microJoules, between 280-300 microJoules, between 290-310 microJoules, between 300-320 microJoules, between 310-330 microJoules, between 320-340 microJoules, or between 330-350 microJoules, and a pulse duration in the range of 10 picoseconds-200 nanoseconds, or more particularly in the range of 20-40 nanoseconds, e.g., between 20-30 nanoseconds, between 25-35 nanoseconds, or between 30-40 nanoseconds. In an example, each conductive contact structure includes a locally deposited metal portion. In an example, exposing the metal foil to the laser beam comprises using a peak power density in the range of 1E+6 to 1E+7 W/mm². Such examples can have advantages over use of a pre-patterned intervening layer, such as removing an expensive patterning operation (e.g., removal of the pre-patterning of an intervening layer) from a processing scheme. Such examples can also enable passivating an edge of a substrate (e.g., a silicon substrate) using a metal foil.

In another aspect, an intervening layer is not patterned during a LAMP laser process, but the LAMP laser process is applied to expose a metal foil to a laser beam to form a plurality of conductive contact structures electrically connected to portions of the substrate and to coincidentally diffuse atoms of the metal foil into portions of the substrate beneath the plurality of conductive contact structures. In one such example, exposing the metal foil to the laser beam includes using a pulse energy in the range of 200-300 microJoules, e.g., between 200-220 microJoules, between 210-230 microJoules, between 220-240 microJoules, between 230-250 microJoules, between 240-260 microJoules, between 250-270 microJoules, between 260-280 microJoules, between 270-290 microJoules, or between 280-300 microJoules, and a pulse duration in the range of 1 nanosecond to 1 millisecond, or more particularly in the range of 110-130 nanoseconds, e.g., between 110-120 nanoseconds, between 115-125 nanoseconds, or between 120-130 nanoseconds. In an example, each conductive contact structure includes a locally deposited metal portion.

In another aspect, an intervening layer is not patterned during a LAMP laser process, but the LAMP laser process is applied to expose a metal foil to a laser beam to form a plurality of conductive contact structures electrically connected to portions of the substrate and to coincidentally crystallize portions of an amorphous semiconductor layer (e.g., amorphous silicon layer) beneath the plurality of conductive contact structures. In one such example, exposing the metal foil to the laser beam includes using a pulse energy in the range of 200-300 microJoules, e.g., between 200-220 microJoules, between 210-230 microJoules, between 220-240 microJoules, between 230-250 microJoules, between 240-260 microJoules, between 250-270 microJoules, between 260-280 microJoules, between 270-290 microJoules, or between 280-300 microJoules, and a pulse duration in the range of 10-200 nanoseconds, and more particularly in the range of 50-70 nanoseconds, e.g., between 50-60 nanoseconds, between 55-65 nanoseconds, or between 60-70 nanoseconds. In an example, each conductive contact structure includes a locally deposited metal portion.

Figure 2A:
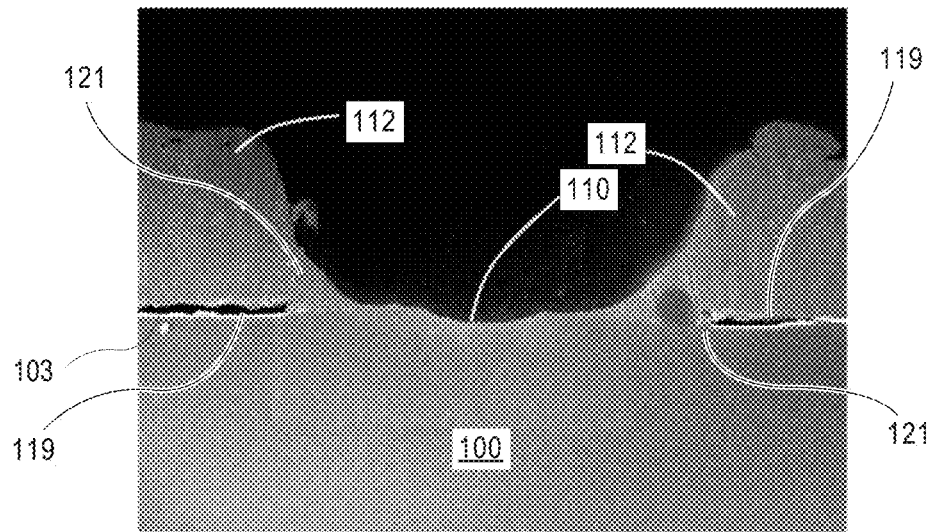
FIGS. 2A and 2B include digital images of cross-sectional views of a solar cell.
Figure 2B:
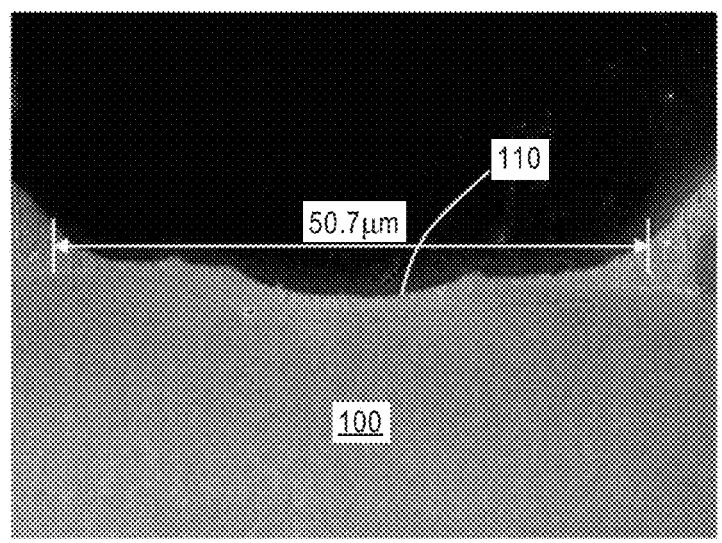

An exemplary structure of a LAMP technique is depicted in FIGS. 2A and 2B. FIGS. 2A and 2B include digital images of cross-sectional views of a solar cell processed with a LAMP technique. Referring to FIG. 2A, a metal foil was exposed to the laser beam to form a plurality of conductive contact structures 110 or "locally deposited" metal portions, electrically connected to the substrate 100, which can include a plurality of N-type and/or P-type semiconductor regions in or above the substrate 100. On either side of the conductive contact structure 110 are the second portions or portions 112 of the metal foil, which are not locally deposited to the substrate 100. These portions 112 can be retained on the patterned intervening layer 103 above substrate. The portions 112 are central portions as depicted in FIGS. 1A-1H. The conductive contact structures 110 can be connected, at least temporarily, until the removal of portions 112, leaving edge portions 121. The portions 112, edge portions 121 and conductive contact structure 110 form a U-shape. Although, in this view, an edge portion is shown, in some examples an edge portion 121 is not formed.

As portions 112 are not directly connected to the substrate 100, a gap 119 is present between the portions 112 and the substrate 100, which is overlain with an intervening layer (e.g., patterned intervening layer 103 as depicted in FIGS. 1D-1H). As can be seen in FIG. 2B, which is a magnification of FIG. 3A, the resulting conductive contact structure 110 or locally deposited metal portion can have an edge feature, such as a sharp or torn edge feature when the second portions or portions 112 are removed, leaving behind at least a portion on the edge portion 121. Such an edge feature can be distinguished from metal structure formed by other metal deposition processes such as by a plating process which can provide conformal structures absent an edge feature.

With reference back to FIGS. 1A-1H, subsequent to exposing the metal foil 106 to the laser beam 108, some portions 112 and 114 of the metal foil 106 can be removed, and other portions 112 can be selectively exposed to the laser beam. An exemplary structure is depicted in FIGS. 3A-3C.

Figure 3A:
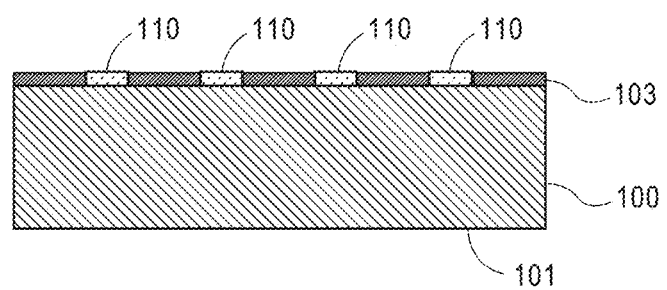
FIGS. 3A-3C illustrate cross-sectional views of a solar cell.
Figure 3B:
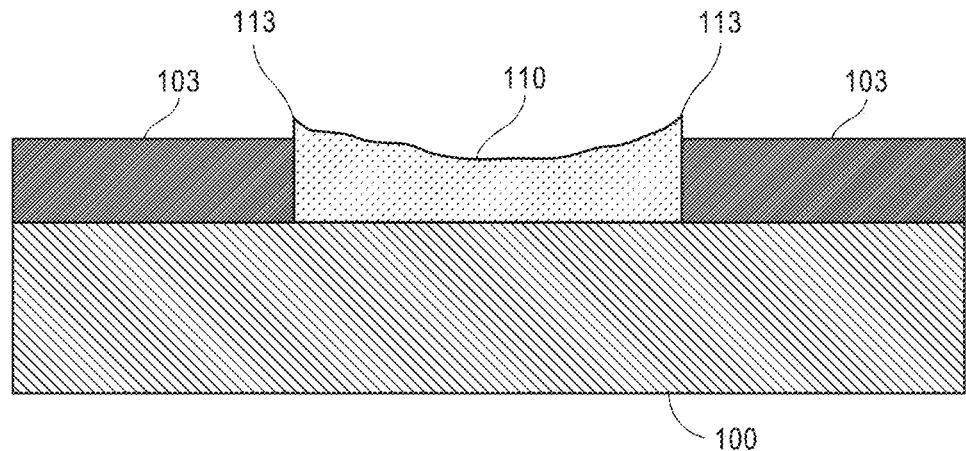
Figure 3C:
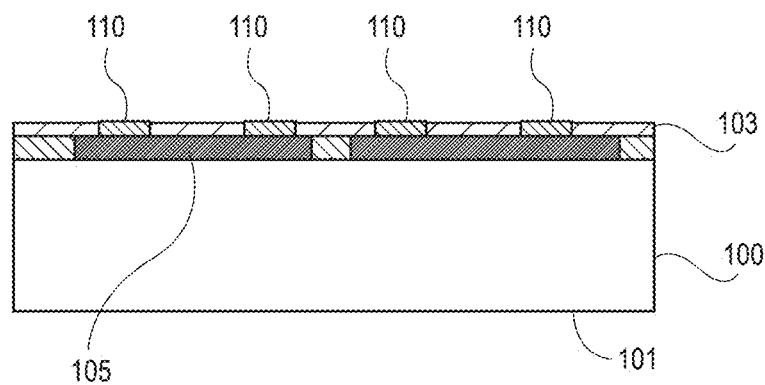

FIGS. 3A-3C illustrate cross-sectional views of a solar cell. As shown in FIG. 3A, removal of the second portions of the metal foil can leave behind the conductive contact structures 110 on the locations in the patterned intervening layer 103 that have exposed portions of the plurality of N-type and/or P-type semiconductor regions in or above the substrate 100. In FIG. 3B, the formation of sharp or torn edge features 113 on either side of the conductive contact structures 110 is shown. These edge features 113, as described above, are formed from the removal the second portions of the metal foil not exposed to the laser beam. With reference to FIGS. 1C, 1D, 1E, 1F, 1G and 1H, in some embodiments, some portions 112 and 114 are removed and other portions 112 and 114 remain. In an embodiment, exposing the metal foil 106 to the laser beam 108 includes removing all or substantially all portions of the metal foil not exposed to the laser beam.

FIG. 3C shows the position of N-type and/or P-type semiconductor regions 105. In the embodiment shown, N-type and/or P-type semiconductor regions 105 are separated from one another, and each semiconductor region has two conductive contact structures 110. Alternatives, not shown, include one, three or more conductive contact structures per semiconductor region. In an example, the N-type and/or P-type semiconductor regions can have trenches formed there between, the trenches extending partially into the substrate, and covered by intervening layer 103. In one example, N-type and/or P-type semiconductor regions can be separated by an intrinsic or lightly doped region there between, e.g., where the lightly doped regions can have a doping concentration substantially less than the N-type and/or P-type semiconductor regions. In some embodiments, the semiconductor regions 105 can have the same conductivity type, are all N-type or P-type, as in some front contact solar cells. It is contemplated that the conductive contact structures 110 can be reinforced with a second metal source as described, as described above.

With reference back to FIGS. 1A-1G, subsequent to applying a laser beam 108 to the metal foil 106, in an example, only portions 114 of the metal foil 106 not exposed to the laser beam 108 are removed, while some portions 112 of the metal foil 106 are retained. In an embodiment, portions 112 can be selectively exposed to the laser beam 108 or a different/subsequent laser beam, which can use the same laser at different laser settings/variables.

Figure 4A:
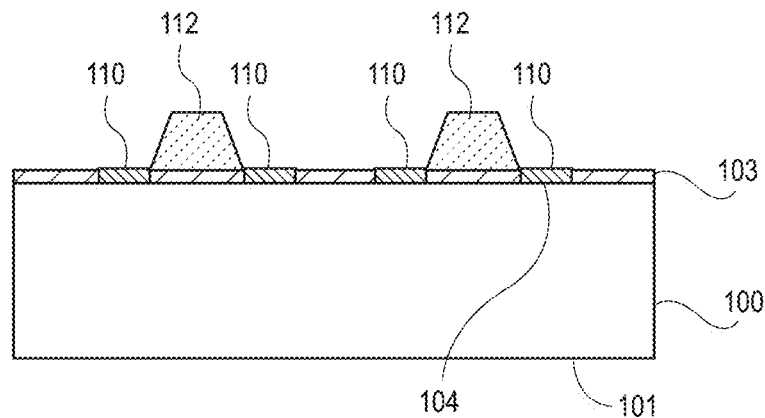
FIGS. 4A and 4B illustrate cross-sectional views of a solar cell.
Figure 4B:
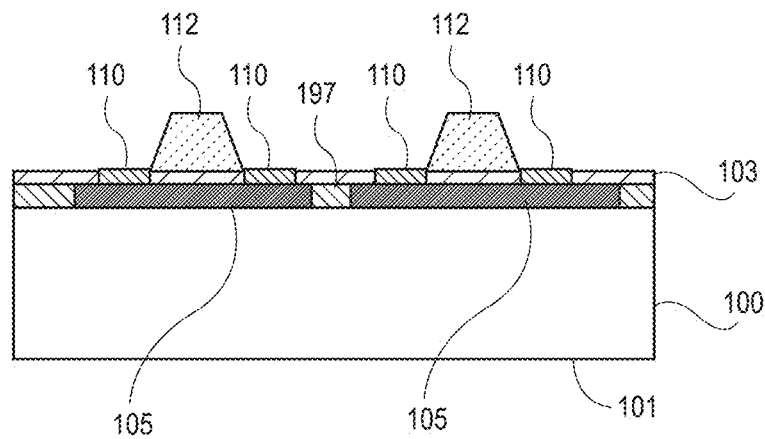

FIGS. 4A and 4B illustrate cross-sectional views of exemplary solar cells. As shown in FIG. 4A, the laser forms the conductive contact structures 110 and portions 112 above the patterned intervening layer 103 (intervening layer), such as an ARC or BARC layer. Portions 114 have been removed. In the example of FIG. 4B, N-type and/or P-type semiconductor regions 105 are separated, for example by a lightly doped region 197 there between, e.g., where the lightly doped regions can have a doping concentration substantially less than the N-type and/or P-type semiconductor regions. In some embodiments, the semiconductor regions 105 can have the same conductivity type, are all N-type or P-type, as in some front contact solar cells. It is contemplated that the conductive contact structures 110 can be reinforced with a second metal source as described, as described above. It is further contemplated that the portions 112 can be formed from a second metal source as described, as described above.

Figure 5:
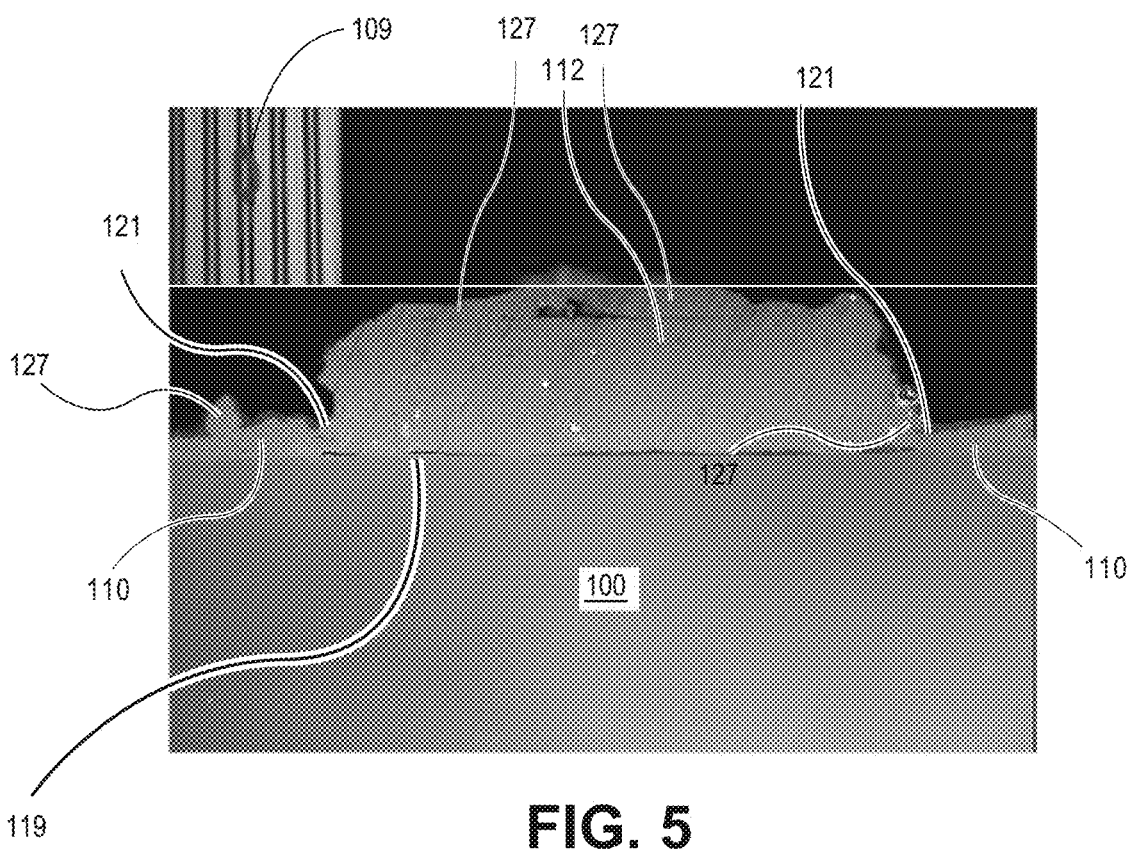
FIG. 5 includes a digital image of cross-sectional views of a solar cell.

FIG. 5 is a digital image of a cross-section of a solar cell subsequent to a LAMP technique. Inset 109 in the upper-left of the digital image shows the region of the solar cell, circled, where the cross-section was taken. In this example, portions 112 of the metal foil 106 are retained. These portions 112 are portions of the metal foil 106 not exposed to the laser beam or exposed to a laser beam having different properties (e.g., power, frequency, etc.). The portions 112 can also be exposed to a different laser beam at subsequent process step. Also, as shown in FIG. 6, the laser forms the conductive contact structures 110 which can be connected to portion 112, where portion 112 is located above the substrate 100. In an embodiment, the portion 112 can carry current between and/or along conductive contact structures 110. In an embodiment, exposing the metal foil to the laser beam can form a spatter feature 127 on the solar cell. Such a spatter feature can be used to determine if the solar cell was formed using one or more of the laser assisted metallization processes disclosed herein, for example as differentiated from a welding or soldering process. Also, optionally, these spatter features on 112 can be removed by mechanical cleaning such as brush or chemical cleaning, a water jet process, high pressure air blowing process, and mechanically grab and peel can be used to remove the region 112 completely. FIG. 6 further shows a gap 119 that is apparent between the portion 112 and the substrate 100, which is overlain with an intervening layer (see intervening layer 104 as depicted in FIGS. 1A-1H). Also seen in this view is the edge portion 121.

Figure 6A:
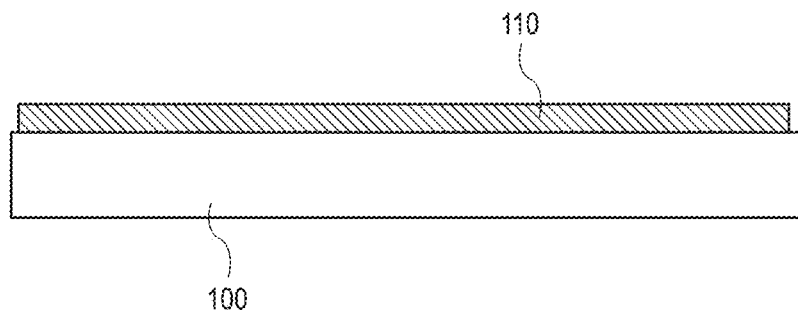
FIGS. 6A-6C illustrate side elevation views of a solar cell.
Figure 6B:
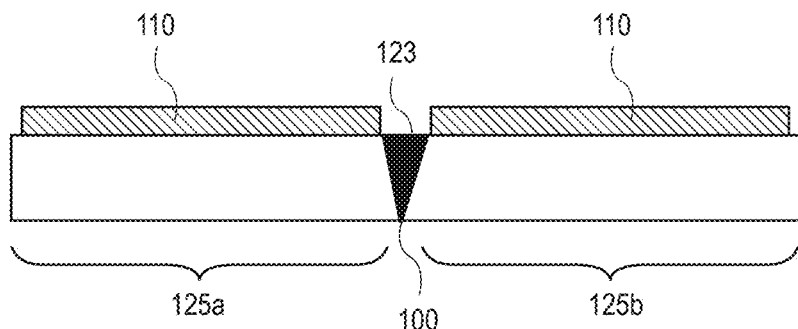
Figure 6C:
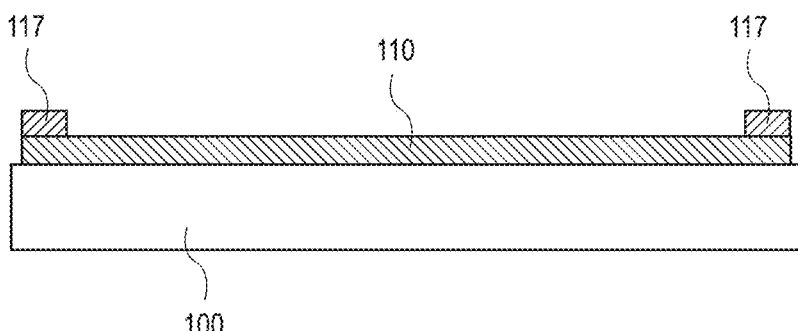

FIGS. 6A-6C show additional examples of a solar cell utilizing a multi-diode technique. FIG. 6A is a side view of a solar cell, in which the conductive contact structures 110 run the length of the substrate 100. FIG. 6B shows a pair of sub-cells 125a and 125b in which the conductive contact structures 110 can run approximately half the length of the substrate 100. In some examples, the conductive contact structures 110 can run approximately ⅓, ¼, ⅕ and/or any fraction of the length of the substrate 100. The conductive contact structures 110 can be formed continuously as shown in FIG. 6A and then laser scribed or otherwise ablated at 123 to from the two sub-cells 125a and 125b. The metal foil 110 can extend over the scribe or ablated portion 123 to electrically and/or mechanically bridge and/or connect the two sub-cells 125a and 125b. Alternatively, they can be formed as separate structures, e.g., with no need to separate or ablate the interconnecting foil. FIG. 6C is a side view of a solar cell, with busbars 117 that run transverse to the conductive contact structures 110 and conduct current across the conductive contact structures 110.

In the various implementations discussed herein, removal of the second portions or portions of the metal foil that are desired to be removed can be accomplished via a mechanical process. The mechanical process can include peeling off the respective portions, thereby separating the second portions from the first portions by tearing or ripping. Laser ablation and chemical etching can also be used to remove the second portions.

Figure 7A:
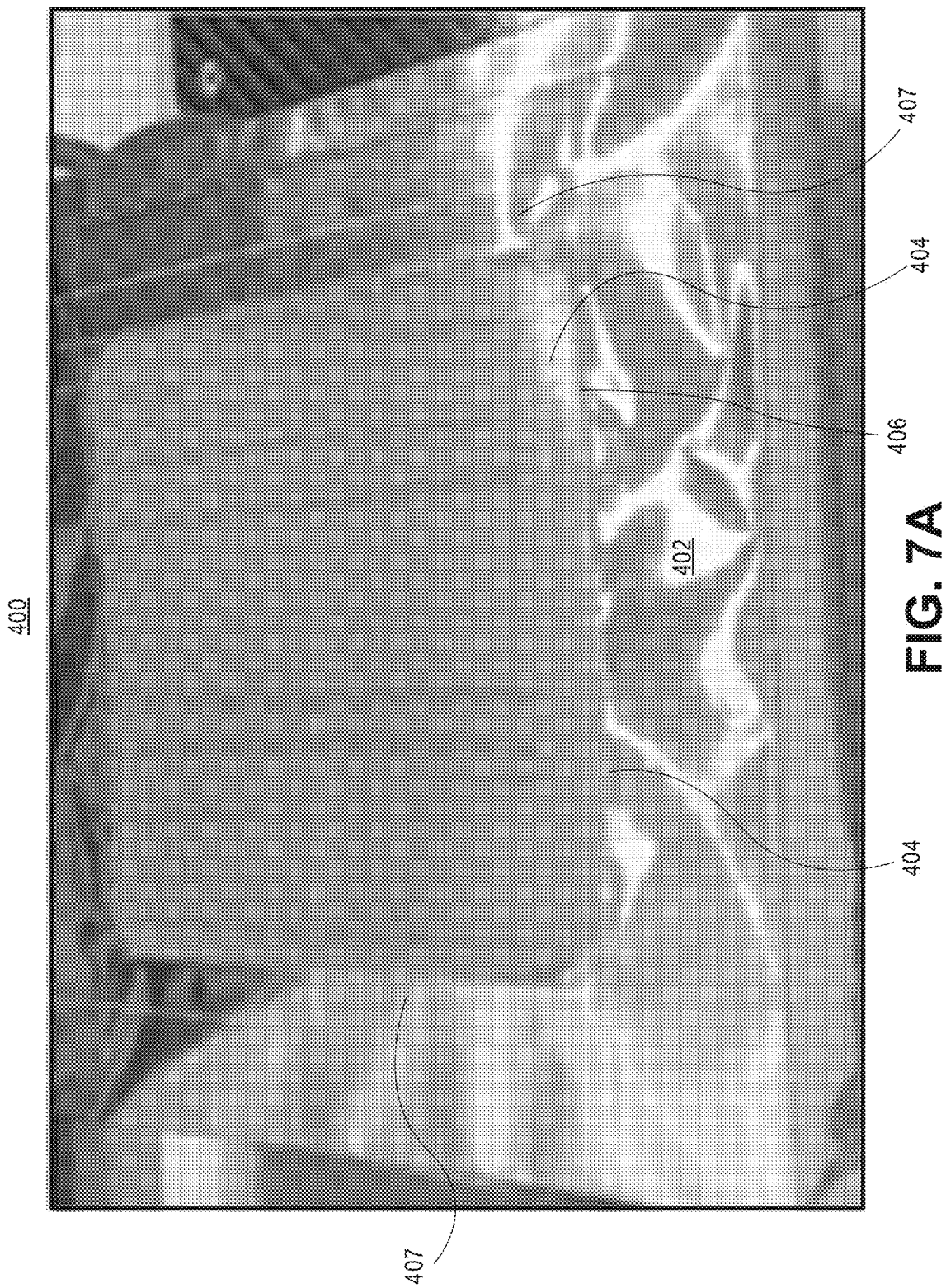
Figure 7B:
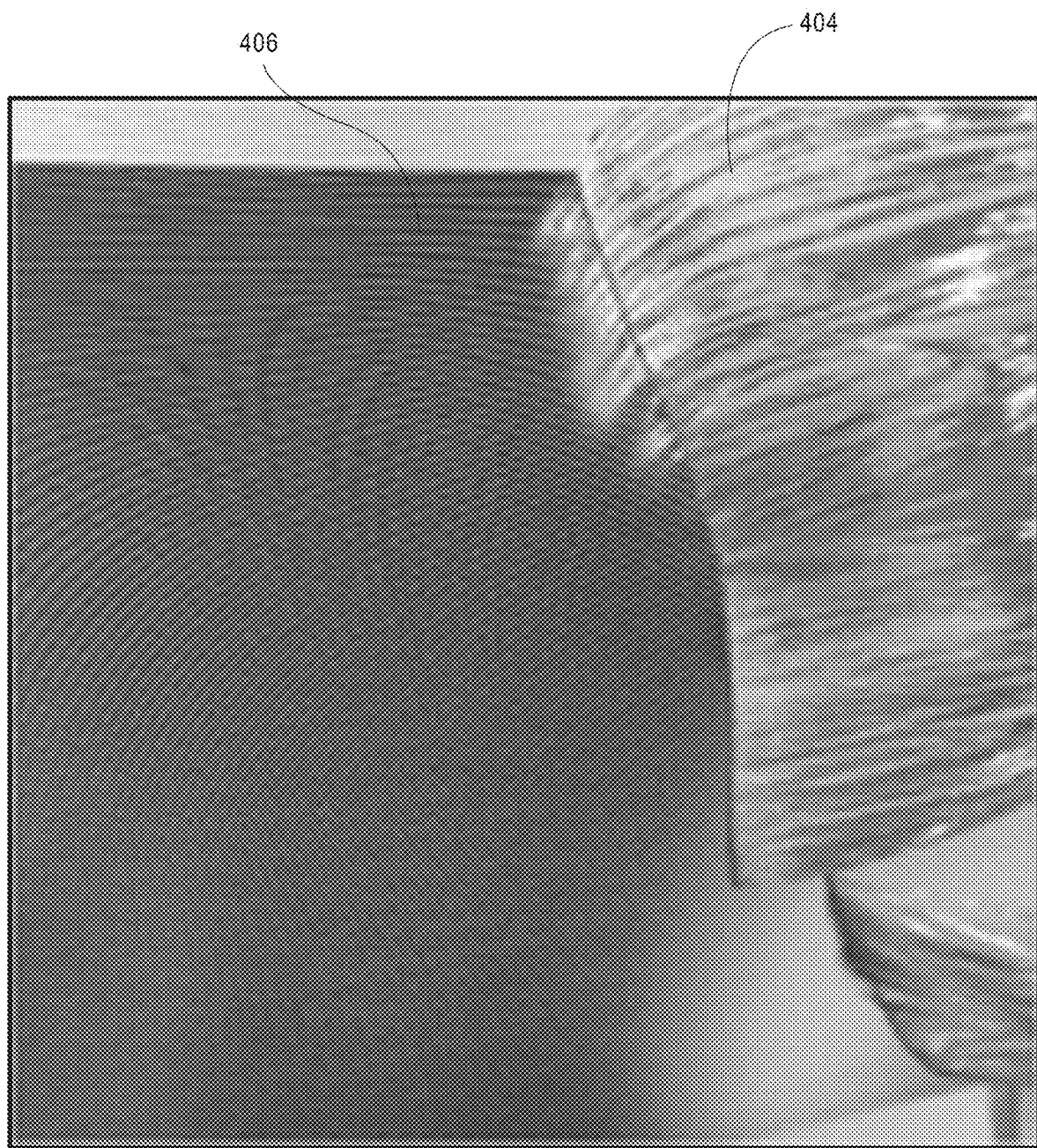

FIGS. 7A-7B and 8A-8B include images of various operations in a method of fabricating a solar cell. Referring to FIG. 7A, in a first approach, a metal source (e.g., metal foil) was placed or located on a surface of a silicon wafer, and then a laser was used to deposit and pattern the metal foil. That is, metal from the metal foil is locally deposited onto the silicon wafer in locations corresponding to a laser scribe/patterning process. Foil that is not laser scribed (or subjected to a laser) can be subsequently removed as shown in FIG. 7B via a mechanical peeling process. FIGS. 8A and 8B show magnified views of the locally deposited metal portions disposed over the substrate. FIGS. 7A-7B and 8A-8B are described in more detail below.

FIG. 7A is a plan view for a setup 400 to place or locate a metal foil 402 over a substrate 406. The setup 400 can include a metal foil 402 placed or fitted over a silicon substrate 406. Portions of the metal foil 402 over the substrate 406 are exposed to a laser beam in locations where openings in an intervening layer expose underlying emitter regions. Portions 404 of the metal foil 402 are not exposed to the laser beam. Portions 407 of the metal foil 402 can overhang the silicon substrate 406, as is depicted. In some embodiments, portions 404 can be exposed to another laser beam having different properties (e.g., power, frequency, etc.) at another operation. The setup 400 can include a vacuum table to hold the substrate 406 in place and hold the metal foil 402 in place atop the substrate 406 to inhibit air gaps or bubbles in the metal foil 402.

FIG. 7B illustrates portions 404 of the metal foil 402 being removed from substrate 406, e.g., by a peel off process. Specifically, excess portions 404 can be peeled off from the substrate 406. The portions 404 can be portions of metal not exposed to a laser, as described above. Portions 404 can also be exposed to the laser beam or to another laser beam having different properties (e.g., power, frequency, etc.) to provide further patterning or ablation. The metal foil can also be removed by blowing (e.g., compressed air), jetting (e.g., using a high-pressure water jet process), applying an adhesive to the portions 404 and pulling of the adhered portions 404, or other metal removal methods.

FIGS. 8A and 8B illustrate an exemplary resulting solar cell structure following the removal of the portions 404 in FIG. 7B. FIGS. 8A and 8B illustrate conductive contacts including metal 410 (e.g., aluminum) remaining as locally deposited (by exposing the metal foil 402 to the laser beam) over openings 417 in the intervening layer 412 of the substrate 406. The locally deposited metal 410 is located over the intervening layer 412, where the intervening layer 412 can be disposed over the substrate 406. The locally deposited metal 410 is located in locations over, partially over, offset from and/or adjacent to the openings in the intervening layer 412. As shown in FIG. 8A, locally deposited metal 410 is partially over or offset from the contact openings in the intervening layer 412 (i.e., partially over or offset from the exposed openings 417 in the intervening layer 412). FIG. 8B illustrates the locally deposited metal 410 aligned with and over the contact openings (not shown—they are covered by the metal 410) the intervening layer 412. FIGS. 8A and 8B illustrate the metal 410 locally deposited on both the intervening layer 412 and the substrate 406 via the openings 417. The intervening layer in such a structure can act as an insulator such that a conductive path is formed to the substrate only via the opening 417. As used here, "substrate" generally refers to a semiconductor region below the intervening layer.

Figure 9A:
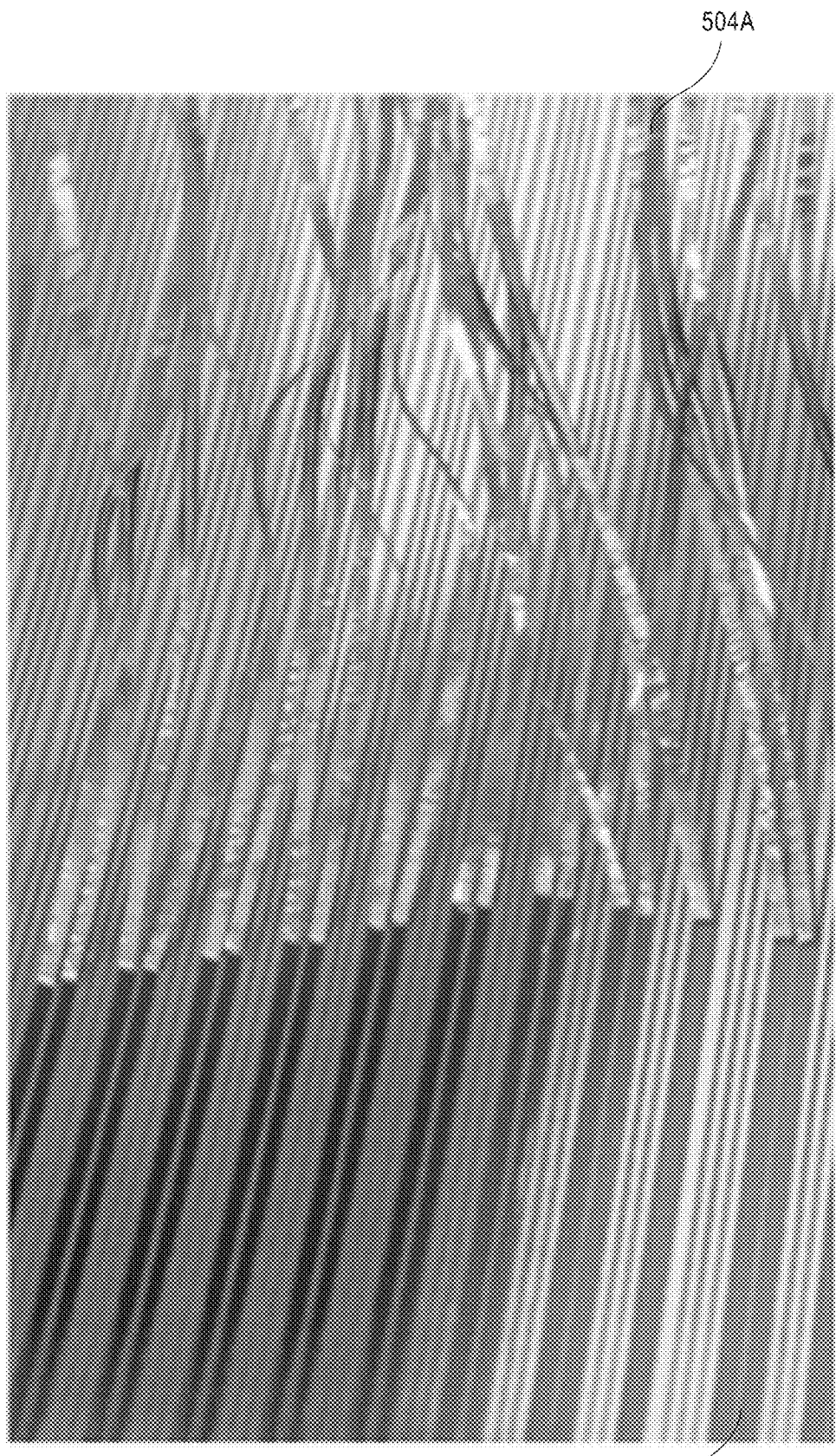
FIGS. 9A and 9B are digital images of various operations in a method of fabricating a solar cell.
Figure 9B:
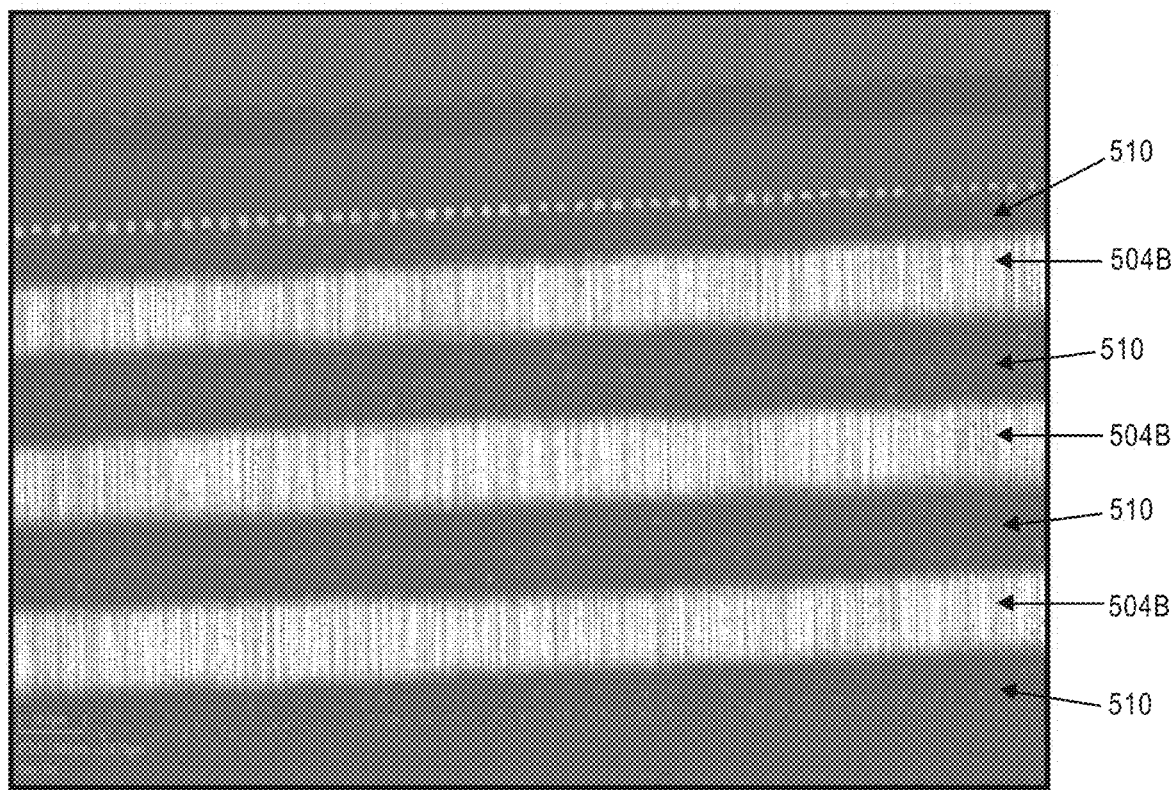

FIGS. 9A-9B are images of various operations in another method of fabricating a solar cell using a LAMP technique.

FIG. 9A illustrates a portion 504A of a metal foil removed from a substrate, where excess portions 504A are peeled off from the substrate.

FIG. 9B illustrates a solar cell structure following removal of the portions 504A of the metal foil 502 from FIG. 9A. Here, however, metal (e.g., aluminum) is locally deposited by a LAMP technique at 510 (for example conductive contact structures 110 in FIG. 1D) and portions 504B of the metal are not exposed to the laser beam and still remain (for example, as 112 in FIG. 1D). These portions 504B that are not exposed to a laser are not removed by a peel off process as per FIG. 9A. On the other hand, these portions 504B remain on the intervening layer between regions 510. As shown, portions 510 are locally deposited metal portions. Subsequent processing can include exposing portions 504B to the laser beam or to another laser beam having different properties (e.g., power, frequency, etc.).

It is to be appreciated that any of all of the structures illustrated in FIGS. 1A-9B can each represent a partially completed solar cell, as further processing can be performed. Alternatively, any of all of the structures illustrate a completed solar cell.

Figure 10A:
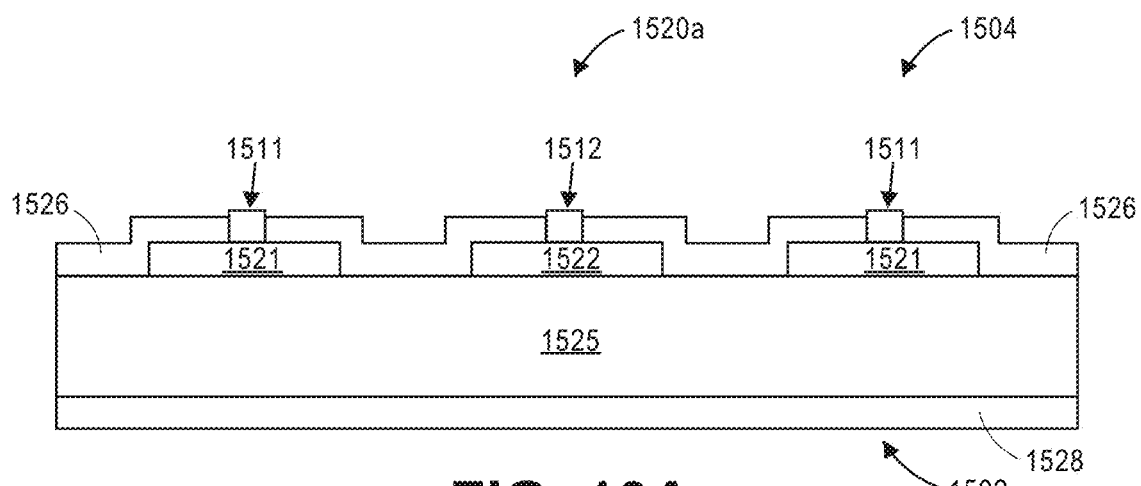
FIGS. 10A-10C illustrate exemplary substrates fabricated using methods, approaches or equipment described herein.
Figure 10B:
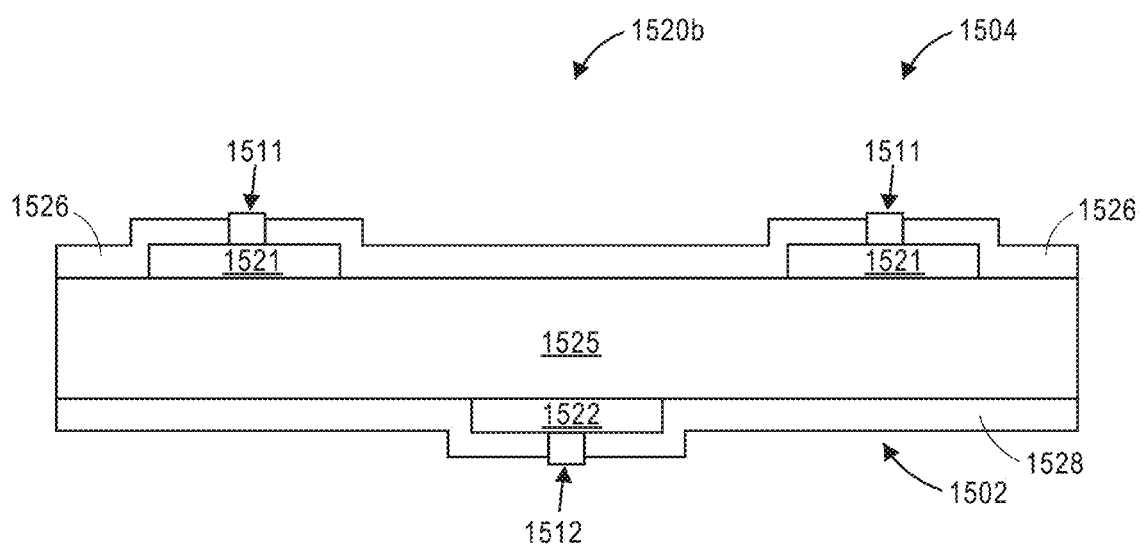
Figure 10C:
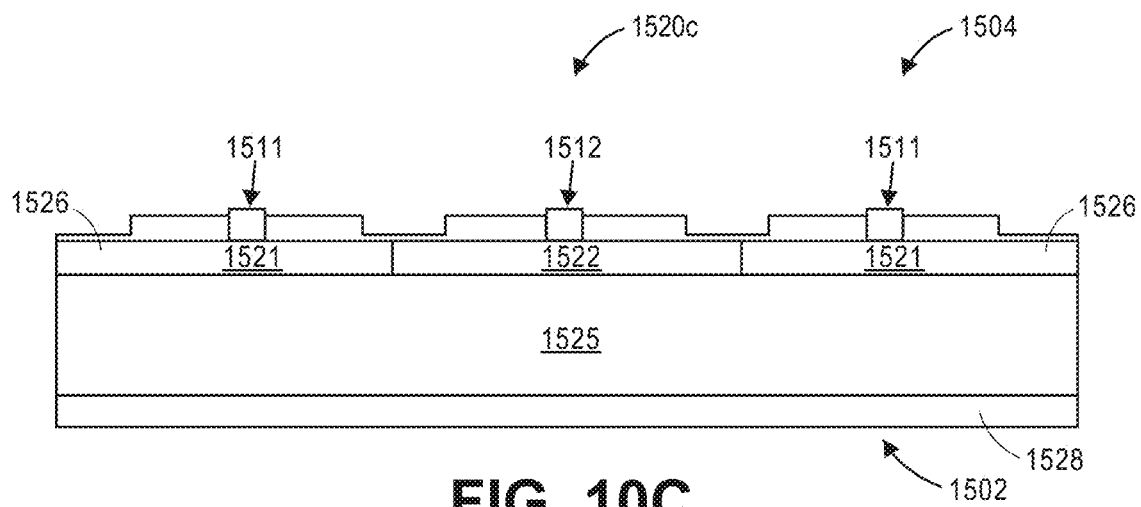

FIGS. 10A, 10B, and 10C illustrate exemplary semiconductor substrates fabricated using methods, approaches or equipment described herein, according to some examples. In an example, the semiconductor substrates are solar cells 1520a, 1520b, 1520c. In an example, the solar cells 1520a, 1520b, 1520c can include a silicon substrate 1525. In some examples, the silicon substrate 1525 can be cleaned, polished, planarized and/or thinned or otherwise processed. In an example, the semiconductor substrate 1525 can be single-crystalline or a multi-crystalline silicon substrate. In an example, the silicon substrate 1525 can be an N-type or a P-type silicon substrate. In an example, the semiconductor substrate can be a monocrystalline silicon substrate, such as a bulk single crystalline N-type doped semiconductor substrate. In an example, the solar cells 1520*a*, 1520*b*, 1520*c* can have a front side 1502 and a back side 1504, where the front side 1502 is opposite the back side 1504. In one example, the front side 1502 can be referred to as a light receiving surface 1502 and the back side 1504 can be referred to as a back surface 1504. In an example, the solar cells 1520*a*, 1520*b*, 1520*c* can include a first doped region 1521 and a second doped region 1522. In an example, the first doped region can be a P-type doped region (e.g., doped with boron) and the second doped region can be an N-type doped region (e.g., doped with phosphorus). In an example, the solar cells 1520*a*, 1520*b*, 1520*c* can include an intervening (ARC) 1528 on the front side 1502 of the solar cells. In some examples, the solar cells 1520*a*, 1520*b*, 1520*c* can include a back intervening (BARC) 1526 on the back side 1504 of the solar cells.

Referring to FIG. 10A, an exemplary back-contact solar cell fabricated using methods, approaches or equipment described herein, according to some examples. The back-contact solar cell 1520*a* can include the first and second doped regions 1521, 1522 on a back side 1504 of a solar cell 1520*a*. In an example, the first and second doped regions 1521, 1522 can be doped semiconductor regions. In a particular example, the first and second doped regions 1521, 1522 can be doped polysilicon regions. In some examples, the first and second doped regions 1521, 1522 can, instead, be located in the substrate 1525. In an example, conductive contact structures 1511, 1512 on the back side 1504 of the solar cell 1520*a*, where the conductive contact structures 1511, 1512 include locally deposited metal on the first and second doped regions 1521, 1522.

With Reference to FIG. 10B, an example front-contact solar cell fabricated using methods, approaches or equipment described herein, according to some examples. The front-contact solar cell 1520*b* can include the first doped regions 1521 on the back side 1504 of the solar cell 1520*b*. In an example, the second doped region 1522 can be on the front side 1502 of the solar cell 1520*b*. Although one example of a second doped region 1522 is shown, one or more, of the second doped region 1522 can be used. In an example, conductive contact structures 1511, 1512 can be on the front and back sides 1504 of the solar cell 1520*b*, where the conductive contact structures 1511, 1512 include locally deposited metal on the first and second doped regions 1521, 1522.

Referring to FIG. 10C, another example of a back-contact solar cell fabricated using methods, approaches or equipment described herein, according to some examples. The back-contact solar cell 1520*a* can include the first and second doped regions 1521, 1522 on a back side 1504 of a solar cell 1520*a*. In an example, the first and second doped regions 1521, 1522 can be doped semiconductor regions that extend in a continuous layer. In a particular example, the first and second doped regions 1521, 1522 can be doped polysilicon regions. In some examples, the first and second doped regions 1521, 1522 can, instead, be located in the substrate 1525. In an example, conductive contact structures 1511, 1512 on the back side 1504 of the solar cell 1520*a*, where the conductive contact structures 1511, 1512 include locally deposited metal on the first and second doped regions 1521, 1522.

Referring to FIGS. 10A-10C, in one embodiment, methods described herein can be applied to both a front-contact and/or a back-contact solar cells. In an example, conductive contact structures 1511, 1512 can be aligned and bonded to doped regions 1521, 1522 on both a front side 1502 and a back side 1504 of a solar cell 1520*b*, as shown in FIG. 10B.

In one example, the conductive contact structures 1511/1512 can be bonded to a single side, e.g., a back side 1504, of another solar cell 1520*a* or 1520*c* as shown in FIGS. 10A and 10C.

Figure 11A:
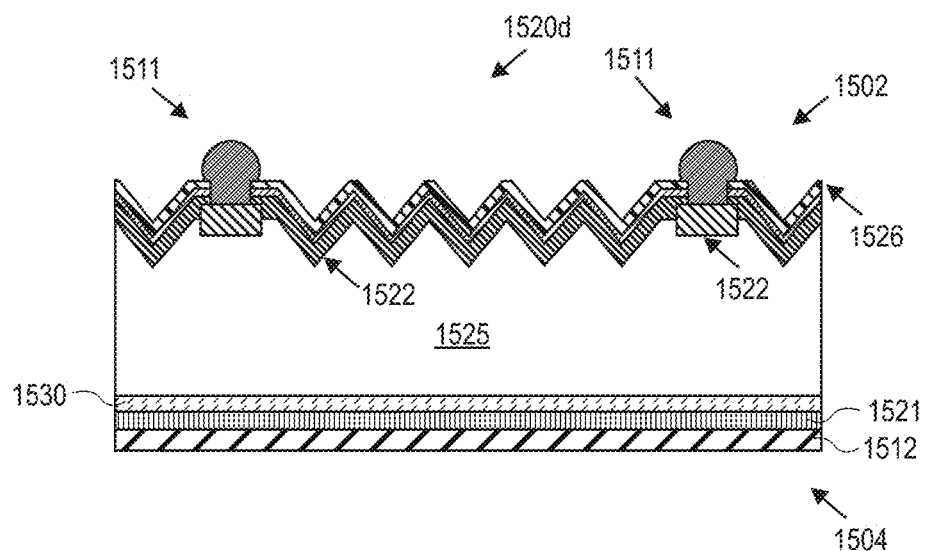
FIGS. 11A-11B illustrate exemplary substrates fabricated using methods, approaches or equipment described herein.
Figure 11B:
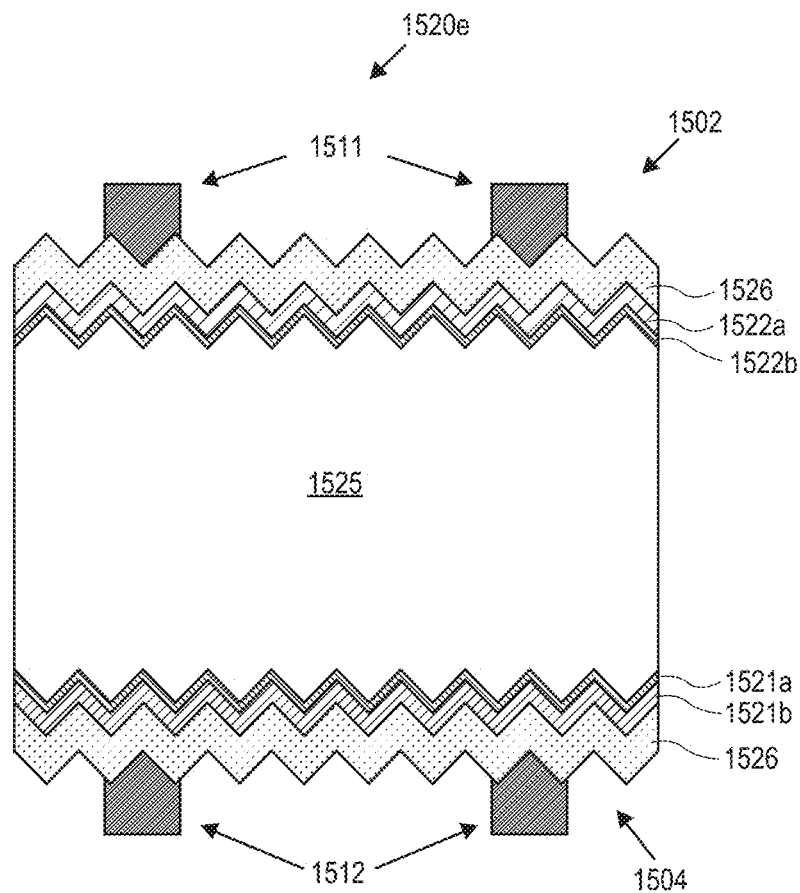

FIGS. 11A-11B illustrate exemplary substrates fabricated using methods, approaches or equipment described herein.

FIG. 11A illustrates an example front-contact solar cell fabricated using methods, approaches or equipment described herein, according to some embodiments. The front-contact solar cell 1520*d* can include the first doped regions 1521 disposed on the back side 1504 of the solar cell 1520*d*. In an example, the second doped regions 1522 can be disposed on the front side 1502 of the solar cell 1520*d*. Conductive contact structures 1511, 1512 can be formed via a LAMP technique on the front and back sides 1502, 1504 of the solar cell 1520*d*, respectively, where the conductive contact structures 1511, 1512 include locally deposited metal on the first and second doped regions 1521, 1522. The first and second doped regions 1521, 1522 can include an amorphous silicon region. The solar cell 1520*d* can include an intervening layer (e.g., an anti-reflective layer coating ARC) 1526 on the front side 1502 of the solar cell 1520*d*. The solar cell 1520*d* can include a back intervening layer (e.g., a back anti-reflective coating BARC) 1526 on the back side 1504 of the solar cell 1520*d*.

FIG. 11B illustrates another exemplary front-contact solar cell fabricated using methods, approaches or equipment described herein, according to some embodiments. The front-contact solar cell 1520*e* can include the first doped regions 1521A, 1521B disposed on the back side 1504 of the solar cell 1520*e*. In an example, the second doped regions 1522 can be disposed on the front side 1502 of the solar cell 1520*e*. Although one example of second doped regions 1522 is shown, one or more of the second doped region 1522 can be used. In an embodiment, conductive contact structures 1511, 1512 can be formed via a LAMP technique on the front and back sides 1504 of the solar cell 1520*b*, respectively, where the conductive contact structures 1511, 1512 include locally deposited metal on the first and second doped regions 1521, 1522. The first doped regions 1521 can include a doped polysilicon region. A thin oxide layer 1530 can be disposed between the first doped region 1521 and the substrate 1525. The solar cell 1520*e* can include an intervening layer (e.g., an anti-reflective coating ARC) 1528 on the front side 1502 of the solar cell 1520*e*. The solar cells 1520*e* can include a back intervening layer (e.g., a back anti-reflective coating BARC) 1526 on the back side 1504 of the solar cell 1520*e*.

FIGS. 12A-12C illustrate side views of operations in a method of fabricating a solar cell string. Referring to FIG. 12A, two solar cells 1225*a* and 1225*b* including substrates 1200 are provided such as described with reference to FIGS. 1A-1H. The substrates include a plurality of conductive contact structures 1210 electrically connected to the substrates 1200 and second portions 1214 of the metal foil 1206 not exposed to the laser beam 1208 are retained on the substrates 1200, overhanding and/or extending from the substrates 1200. The solar cells 1225*a* and 1225*b* are stacked together with the conductive contact structures 1210 on the exterior of the stack. The second portions 1214 are bonded together at position 1211 to form a bond 1215 as shown in FIG. 12B. In an embodiment, the bonding can be done by a laser process as described herein. In an embodiment, the bonding is a welding process, such as laser welding, ultrasonic welding, or induction welding. In embodiment, the bond can be formed by thermocompression bonding. In an embodiment, the bonding is accomplished with a conductive adhesive. Two solar cells can be attached using this process as well. The solar cells 1225a and 1225b can be unfolded as depicted by the arrow to form a linear string. As shown in FIG. 12B that process can be repeated multiple times to create an almost limitless string, such as by adding solar cell 1225c as depicted in FIG. 12B. Although, there are 3 solar cells shown in FIG. 12C, there can be 2, 3, 4, 5, 6, or more solar cells connected in a solar cell string. In addition different procedures and steps can be performed to form the solar cell strings shown. In an embodiment strings of solar cells can be connected together by stacking the strings together, for example with their front sides facing, and bonding the metal foil extending from one solar cell at the end of a first solar cell string to a complementary metal foil extending from a solar cell at the end of a second solar string that is stacked over the first solar cell string.

Although certain materials are described specifically with reference to above described embodiments, some materials can be readily substituted with others with such embodiments remaining within the spirit and scope of embodiments of the present disclosure. For example, in an embodiment, a different material substrate, such as a group III-V material substrate, can be used instead of a silicon substrate. In another embodiment, any type of substrate used in the fabrication of micro-electronic devices can be used instead of a silicon substrate, e.g., a printed circuit board (PCB) and/or other substrates can be used. Additionally, although reference is made significantly to back contact solar cell arrangements, it is to be appreciated that approaches described herein can have application to front contact solar cells as well. In other embodiments, the above described approaches can be applicable to manufacturing of other than solar cells. For example, manufacturing of light emitting diode (LEDs) can benefit from approaches described herein.

Additionally, although solar cells are described in great detail herein, the methods and/or processes described herein can apply to various substrates and/or devices, e.g., semiconductor substrates. For example, a semiconductor substrate can include a solar cell, light emitting diode, microelectromechanical systems and other substrates.

Furthermore, although many embodiments described pertain to directly contacting a semiconductor with a metal foil as a metal source. Concepts described herein can also be applicable to solar applications (e.g., HIT cells) where a contact is made to a conductive oxide, such as indium tin oxide (ITO), rather than contacting a semiconductor directly. Additionally, embodiments can be applicable to other patterned metal applications, e.g., PCB trace formation.

Thus, local metallization of semiconductor substrates using a laser beam, and the resulting structures are presented.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims can be formulated during prosecution of this application (or an application claiming priority thereto) to any such combination of features. In particular, with reference to the appended claims, features from dependent claims can be combined with those of the independent claims and features from respective independent claims can be combined in any appropriate manner and not merely in the specific combinations enumerated in the appended claims.

Example embodiment 1: A method of fabricating a solar cell includes providing a substrate having an intervening layer thereon. The method also includes locating a metal foil over the intervening layer. The method also includes exposing the metal foil to a laser beam, wherein exposing the metal foil to the laser beam forms openings in the intervening layer and forms a plurality of conductive contact structures electrically connected to portions of the substrate exposed by the openings.

Example embodiment 2: The method of example embodiment 1, wherein exposing the metal foil to the laser beam includes using a pulse energy in the range of 200-350 microJoules.

Example embodiment 3: The method of example embodiment 1 or 2, wherein exposing the metal foil to the laser beam includes using a pulse duration in the range of 10 picoseconds-200 nanoseconds.

Example embodiment 4: The method of example embodiment 1, 2 or 3, wherein each conductive contact structure includes a locally deposited metal portion.

Example embodiment 5: The method of example embodiment 1, 2, 3 or 4, wherein locating the metal foil over the substrate includes locating a continuous sheet of the metal foil over the substrate.

Example embodiment 6: The method of example embodiment 1, 2, 3, 4 or 5, wherein the substrate includes a plurality of alternating N-type and P-type semiconductor regions, and wherein the openings in the intervening layer expose portions of the plurality of alternating N-type and P-type semiconductor regions.

Example embodiment 7: The method of example embodiment 1, 2, 3, 4 or 5, further including forming a plurality of semiconductor regions in or above the substrate.

Example embodiment 8: The method of example embodiment 1, 2, 3, 4, 5, 6 or 7, further including: subsequent to exposing the metal foil to the laser beam, removing at least a portion of the metal foil not exposed to the laser beam.

Example embodiment 9: The method of example embodiment 8, wherein removing at least the portion of the metal foil not exposed to the laser beam includes removing all portions of the metal foil not exposed to the laser beam.

Example embodiment 10: The method of example embodiment 8 or 9, wherein removing at least a portion of the metal foil not exposed to the laser beam includes forming an edge feature at an edge of the conductive contact structures.

Example embodiment 11: The method of example embodiment 10, wherein the edge feature includes a sharp edge, a torn edge, or a combination thereof.

Example embodiment 12: The method of example embodiment 1, 2, 3, 4, 5, 6, 7, 8, 9, 10 or 11, wherein exposing the metal foil to the laser beam forms a spatter feature.

Example embodiment 13: The method of example embodiment 12, further including removing the spatter feature.

Example embodiment 14: A method of fabricating a solar cell includes locating a metal foil over a substrate. The method also includes exposing the metal foil to a laser beam, wherein exposing the metal foil to the laser beam forms a plurality of conductive contact structures electrically connected to portions of the substrate and diffuses atoms of the metal foil into portions of the substrate beneath the plurality of conductive contact structures.

Example embodiment 15: The method of example embodiment 14, wherein exposing the metal foil to the laser beam includes using a pulse energy in the range of 200-300 microJoules.

Example embodiment 16: The method of example embodiment 14 or 15, wherein exposing the metal foil to the laser beam includes using a pulse duration in the range of 1 nanosecond to 1 millisecond.

Example embodiment 17: The method of example embodiment 14, 15 or 16, wherein each conductive contact structure includes a locally deposited metal portion.

Example embodiment 18: A method of fabricating a solar cell includes providing a substrate having an amorphous semiconductor layer thereon. The method also includes locating a metal foil over the amorphous semiconductor layer. The method also includes exposing the metal foil to a laser beam, wherein exposing the metal foil to the laser beam forms a plurality of conductive contact structures electrically connected to portions of the substrate and crystallizes portions of the amorphous semiconductor layer beneath the plurality of conductive contact structures.

Example embodiment 19: The method of example embodiment 18, wherein exposing the metal foil to the laser beam includes using a pulse energy in the range of 200-300 microJoules.

Example embodiment 20: The method of example embodiment 18 or 19, wherein exposing the metal foil to the laser beam includes using a pulse duration in the range of 10-200 nanoseconds.

Example embodiment 21: The method of example embodiment 18, 19 or 20, wherein each conductive contact structure includes a locally deposited metal portion.

What is claimed is:

1. A method of fabricating a solar cell, the method comprising:
    providing a substrate having a continuous intervening layer thereon;
    locating a metal foil over the continuous intervening layer; and
    exposing the metal foil to a laser beam to form a conductive path through the continuous intervening layer and to form a conductive contact structure electrically connected to the substrate by the conductive path and to leave remaining unexposed metal foil, wherein the conductive contact structure includes a metal portion of the metal foil, the metal portion of the conductive contact structure connected to the remaining unexposed metal foil by a weakened structure of the metal foil, the weakened structure of the metal foil including patterning;
    subsequent to exposing the metal foil to the laser beam, separating and removing less than an entirety of the remaining unexposed metal foil by separating a portion of the remaining unexposed metal foil from the metal portion along the weakened structure and to leave remaining the weakened structure of the metal foil including the patterning and to leave portions of the remaining unexposed metal foil that overhang outermost edges of the substrate.

2. The method of claim 1, wherein exposing the metal foil to the laser beam comprises using a pulse energy in the range of 200-350 microJoules.

3. The method of claim 1, wherein exposing the metal foil to the laser beam comprises using a pulse duration in the range of 10 picoseconds-200 nanoseconds.

4. The method of claim 1, wherein locating the metal foil over the substrate comprises locating a continuous sheet of the metal foil over the substrate.

5. The method of claim 1, wherein the substrate comprises a plurality of alternating N-type and P-type semiconductor regions.

6. The method of claim 1, further comprising:
    forming a plurality of semiconductor regions in or above the substrate.

7. The method of claim 1, wherein:
    the exposing the metal foil to a laser beam forms the conductive contact structure by diffusing atoms of the metal foil into the substrate.

8. The method of claim 7, wherein exposing the metal foil to the laser beam comprises using a pulse energy in the range of 200-300 microJoules.

9. The method of claim 7, wherein exposing the metal foil to the laser beam comprises using a pulse duration in the range of 1 nanosecond to 1 millisecond.

10. The method of claim 1, wherein:
    the continuous intervening layer includes an amorphous semiconductor layer, and
    the exposing the metal foil to the laser beam crystallizes a portion of the amorphous semiconductor layer.

11. The method of claim 10, wherein exposing the metal foil to the laser beam comprises using a pulse energy in the range of 200-300 microJoules.

12. The method of claim 10, wherein exposing the metal foil to the laser beam comprises using a pulse duration in the range of 10-200 nanoseconds.

13. The method of claim 1, wherein the patterning includes perforation.

* * * * *

UNITED STATES PATENT AND TRADEMARK OFFICE
CERTIFICATE OF CORRECTION

| | | |
|---|---|---|
| PATENT NO. | : 11,949,037 B2 | |
| APPLICATION NO. | : 17/744519 | |
| DATED | : April 2, 2024 | |
| INVENTOR(S) | : Lu et al. | |

It is certified that error appears in the above-identified patent and that said Letters Patent is hereby corrected as shown below:

On the Title Page

In the Related U.S. Application Data (63) section, first line, delete "Continuation-in-part" and insert -- Continuation --.

Signed and Sealed this
Eighteenth Day of June, 2024

Katherine Kelly Vidal
*Director of the United States Patent and Trademark Office*